(12) United States Patent  
Veenstra et al.

(10) Patent No.: US 8,230,575 B2
(45) Date of Patent: Jul. 31, 2012

(54) OVERMOLDED CIRCUIT BOARD AND METHOD

(75) Inventors: Thomas J. Veenstra, Zeeland, MI (US); Jason R. Mulder, Zeeland, MI (US); Eric L. Fleischmann, Holland, MI (US)

(73) Assignee: Innotec Corporation, Zeeland, MI (US)

( * ) Notice: Subject to any disclaimer, the term of this patent is extended or adjusted under 35 U.S.C. 154(b) by 641 days.

(21) Appl. No.: 12/333,397

(22) Filed: Dec. 12, 2008

(65) Prior Publication Data

US 2009/0154182 A1    Jun. 18, 2009

Related U.S. Application Data

(60) Provisional application No. 61/013,097, filed on Dec. 12, 2007.

(51) Int. Cl.
*H05K 5/00* (2006.01)
*H05K 7/00* (2006.01)

(52) U.S. Cl. ....... 29/592.1; 361/737; 361/751; 361/752; 174/377; 174/378

(58) Field of Classification Search ............... 174/377, 174/378; 361/751, 752, 737; 29/592.1
See application file for complete search history.

(56) References Cited

U.S. PATENT DOCUMENTS

| | | | |
|---|---|---|---|
| 1,515,717 A | 11/1924 | Ayotte | |
| 2,254,962 A | 9/1941 | Harris et al. | |
| 3,456,043 A | 7/1969 | Emery | |
| 3,541,488 A | 11/1970 | Odson | |
| 4,041,301 A | 8/1977 | Pelchat | |
| 4,173,035 A | 10/1979 | Hoyt | |
| 4,211,955 A | 7/1980 | Ray | |
| 4,267,559 A | 5/1981 | Johnson et al. | |
| 4,277,819 A | 7/1981 | Sobota et al. | |
| 4,453,903 A | 6/1984 | Pukaite | |
| 4,544,991 A | 10/1985 | Gorsuch | |
| 4,645,970 A | 2/1987 | Murphy | |
| 4,733,335 A | 3/1988 | Serizawa et al. | |
| 4,744,011 A | 5/1988 | Tomita et al. | |
| 4,764,645 A | 8/1988 | Takasawa | |
| 4,788,630 A | 11/1988 | Gavagan | |
| 4,794,431 A | 12/1988 | Park | |
| 4,819,136 A | 4/1989 | Ramsey | |

(Continued)

FOREIGN PATENT DOCUMENTS

DE    39 16 875 A1    12/1990

(Continued)

OTHER PUBLICATIONS

International Search Report, International Application No. PCT/US2008/076859, filed Sep. 18, 2008.

(Continued)

*Primary Examiner* — Anthony Haughton
(74) *Attorney, Agent, or Firm* — Price Heneveld LLP

(57) ABSTRACT

An electrical device includes a circuit board having one or more electrical components mounted to the circuit board. At least a portion of the circuit board is encapsulated in a thermoplastic polymer material to encapsulate the electrical components. The device may be fabricated by at least partially shielding the electrical components with polymer material, followed by overmolding the polymer material with thermoplastic polymer material. The shielding material may comprise a pre-formed component, or it may comprise thermoplastic polymer material that is molded around the electrical components in a first molding step or "shot".

15 Claims, 29 Drawing Sheets

U.S. PATENT DOCUMENTS

| | | | |
|---|---|---|---|
| 4,857,483 A | 8/1989 | Steffen et al. | |
| 4,860,436 A | 8/1989 | Hirabayashi et al. | |
| 4,885,663 A | 12/1989 | Parker | |
| 4,886,960 A | 12/1989 | Molyneux et al. | |
| 4,897,771 A | 1/1990 | Parker | |
| 4,907,132 A | 3/1990 | Parker | |
| 4,935,665 A | 6/1990 | Murata | |
| 4,948,242 A | 8/1990 | Desmond et al. | |
| 4,954,308 A | 9/1990 | Yabe et al. | |
| 4,965,933 A | 10/1990 | Mraz et al. | |
| 4,965,950 A | 10/1990 | Yamada | |
| 4,985,810 A | 1/1991 | Ramsey | |
| 5,036,248 A | 7/1991 | McEwan et al. | |
| 5,038,255 A | 8/1991 | Nishihashi et al. | |
| 5,070,219 A | 12/1991 | Grosskrueger et al. | |
| 5,119,174 A | 6/1992 | Chen | |
| 5,136,483 A | 8/1992 | Schoniger et al. | |
| 5,160,200 A | 11/1992 | Cheselske | |
| 5,160,201 A | 11/1992 | Wrobel | |
| 5,161,872 A | 11/1992 | Sasaki et al. | |
| 5,178,448 A | 1/1993 | Adams et al. | |
| 5,182,032 A | 1/1993 | Dickie et al. | |
| 5,193,895 A | 3/1993 | Naruke et al. | |
| 5,203,060 A | 4/1993 | Mraz et al. | |
| 5,228,223 A | 7/1993 | Lan | |
| 5,236,374 A | 8/1993 | Leonard et al. | |
| 5,239,406 A | 8/1993 | Lynam | |
| 5,241,457 A | 8/1993 | Sasajima et al. | |
| 5,249,104 A | 9/1993 | Mizobe | |
| 5,285,060 A | 2/1994 | Larson et al. | |
| 5,297,010 A | 3/1994 | Camarota et al. | |
| 5,313,729 A | 5/1994 | Sakai et al. | |
| 5,325,271 A | 6/1994 | Hutchisson | |
| 5,325,275 A | 6/1994 | Liu | |
| 5,334,539 A | 8/1994 | Shinar et al. | |
| 5,337,225 A | 8/1994 | Brookman | |
| 5,355,245 A | 10/1994 | Lynam | |
| 5,371,659 A | 12/1994 | Pastrick et al. | |
| 5,382,811 A | 1/1995 | Takahashi | |
| 5,404,282 A | 4/1995 | Klinke et al. | |
| 5,430,627 A | 7/1995 | Nagano | |
| 5,463,280 A | 10/1995 | Johnson | |
| 5,467,627 A | 11/1995 | Smith et al. | |
| 5,497,305 A | 3/1996 | Pastrick et al. | |
| 5,497,306 A | 3/1996 | Pastrick | |
| 5,499,170 A | 3/1996 | Gagne | |
| 5,527,743 A | 6/1996 | Variot | |
| 5,530,240 A | 6/1996 | Larson et al. | |
| 5,563,422 A | 10/1996 | Nakamura et al. | |
| 5,567,036 A | 10/1996 | Theobald et al. | |
| 5,568,964 A | 10/1996 | Parker et al. | |
| 5,570,272 A | 10/1996 | Variot | |
| 5,572,812 A | 11/1996 | Mastuoka | |
| 5,578,839 A | 11/1996 | Nakamura et al. | |
| 5,613,751 A | 3/1997 | Parker et al. | |
| 5,617,297 A * | 4/1997 | Lo et al. | 361/737 |
| 5,618,096 A | 4/1997 | Parker et al. | |
| 5,632,551 A | 5/1997 | Roney et al. | |
| 5,641,221 A | 6/1997 | Schindele et al. | |
| 5,649,756 A | 7/1997 | Adams et al. | |
| 5,652,434 A | 7/1997 | Nakamura et al. | |
| 5,669,698 A | 9/1997 | Veldman et al. | |
| 5,669,699 A | 9/1997 | Pastrick et al. | |
| 5,669,704 A | 9/1997 | Pastrick | |
| 5,671,996 A | 9/1997 | Bos et al. | |
| 5,673,994 A | 10/1997 | Fant, Jr. et al. | |
| 5,680,245 A | 10/1997 | Lynam | |
| 5,708,428 A | 1/1998 | Phillips | |
| 5,722,281 A | 3/1998 | Yasuda et al. | |
| 5,734,182 A | 3/1998 | Nakamura et al. | |
| 5,746,497 A | 5/1998 | Machida | |
| 5,747,832 A | 5/1998 | Nakamura et al. | |
| 5,752,766 A | 5/1998 | Bailey et al. | |
| 5,765,940 A | 6/1998 | Levy et al. | |
| 5,786,665 A | 7/1998 | Ohtsuki et al. | |
| 5,803,579 A | 9/1998 | Turnbull et al. | |
| 5,806,965 A | 9/1998 | Deese | |
| 5,848,837 A | 12/1998 | Gustafson | |
| 5,868,116 A | 2/1999 | Betts et al. | |
| 5,876,107 A | 3/1999 | Parker et al. | |
| 5,877,558 A | 3/1999 | Nakamura et al. | |
| 5,880,486 A | 3/1999 | Nakamura et al. | |
| 5,894,686 A | 4/1999 | Parker et al. | |
| 5,895,115 A | 4/1999 | Parker et al. | |
| 5,909,037 A | 6/1999 | Rajkomar et al. | |
| 5,915,830 A | 6/1999 | Dickson et al. | |
| 5,921,652 A | 7/1999 | Parker et al. | |
| 5,921,660 A | 7/1999 | Yu | |
| 5,927,845 A | 7/1999 | Gustafson | |
| 5,934,798 A | 8/1999 | Roller et al. | |
| 5,938,321 A | 8/1999 | Bos et al. | |
| 5,944,414 A | 8/1999 | Nishitani et al. | |
| 5,945,688 A | 8/1999 | Kasahara et al. | |
| 5,947,588 A | 9/1999 | Huang | |
| 5,951,349 A | 9/1999 | Larose et al. | |
| 5,998,925 A | 12/1999 | Shimizu et al. | |
| 6,000,287 A | 12/1999 | Menzel | |
| 6,005,210 A | 12/1999 | Chien | |
| 6,030,089 A | 2/2000 | Parker et al. | |
| 6,045,240 A | 4/2000 | Hochstein | |
| 6,049,463 A * | 4/2000 | O'Malley et al. | 361/760 |
| 6,070,998 A | 6/2000 | Jennings et al. | |
| 6,079,838 A | 6/2000 | Parker et al. | |
| 6,082,870 A | 7/2000 | George | |
| 6,097,501 A | 8/2000 | Hayashi et al. | |
| 6,113,247 A | 9/2000 | Adams et al. | |
| 6,113,248 A | 9/2000 | Mistopoulos et al. | |
| 6,124,886 A | 9/2000 | DeLine et al. | |
| 6,139,172 A | 10/2000 | Bos et al. | |
| 6,152,575 A | 11/2000 | Montanino | |
| 6,152,590 A | 11/2000 | Furst et al. | |
| 6,158,867 A | 12/2000 | Parker et al. | |
| 6,158,882 A | 12/2000 | Bischoff, Jr. | |
| 6,162,381 A | 12/2000 | Onishi et al. | |
| 6,164,805 A | 12/2000 | Hulse | |
| 6,170,313 B1 | 1/2001 | Vasseur et al. | |
| 6,190,026 B1 | 2/2001 | Moore | |
| 6,204,512 B1 | 3/2001 | Nakamura et al. | |
| 6,215,133 B1 | 4/2001 | Nakamura et al. | |
| 6,220,722 B1 | 4/2001 | Begemann | |
| 6,234,648 B1 | 5/2001 | Borner et al. | |
| 6,244,734 B1 | 6/2001 | Hulse | |
| 6,255,613 B1 | 7/2001 | Yang | |
| 6,276,822 B1 | 8/2001 | Bedrosian et al. | |
| 6,283,612 B1 | 9/2001 | Hunter | |
| 6,347,880 B1 | 2/2002 | Furst et al. | |
| 6,357,902 B1 | 3/2002 | Horowitz | |
| 6,371,636 B1 | 4/2002 | Wesson | |
| 6,402,570 B2 | 6/2002 | Soga et al. | |
| 6,404,131 B1 | 6/2002 | Kawano et al. | |
| 6,412,973 B1 | 7/2002 | Bos et al. | |
| 6,419,306 B2 | 7/2002 | Sano et al. | |
| 6,461,017 B2 | 10/2002 | Selkee | |
| 6,469,323 B1 | 10/2002 | Nakamura et al. | |
| 6,483,623 B1 | 11/2002 | Maruyama | |
| 6,531,324 B2 | 3/2003 | Hsu et al. | |
| 6,531,328 B1 | 3/2003 | Chen | |
| 6,536,923 B1 | 3/2003 | Merz | |
| 6,580,228 B1 | 6/2003 | Chen et al. | |
| 6,583,550 B2 | 6/2003 | Iwasa et al. | |
| 6,595,671 B2 | 7/2003 | Lefebvre et al. | |
| 6,598,996 B1 | 7/2003 | Lodhie | |
| 6,604,834 B2 | 8/2003 | Kalana | |
| 6,616,313 B2 | 9/2003 | Fuerst | |
| 6,617,786 B1 | 9/2003 | Centofante | |
| 6,653,572 B2 | 11/2003 | Ishiwa et al. | |
| 6,659,632 B2 | 12/2003 | Chen | |
| 6,669,267 B1 | 12/2003 | Lynam et al. | |
| 6,673,292 B1 | 1/2004 | Gustafson et al. | |
| 6,682,331 B1 | 1/2004 | Peh et al. | |
| 6,683,250 B2 | 1/2004 | Luettgen et al. | |
| 6,709,132 B2 | 3/2004 | Ishibashi | |
| 6,709,137 B1 | 3/2004 | Glovak et al. | |
| 6,724,543 B1 | 4/2004 | Chinniah et al. | |
| 6,726,502 B1 | 4/2004 | Hayes | |
| 6,729,055 B2 | 5/2004 | Chou | |
| 6,739,733 B1 | 5/2004 | Lamke et al. | |

| | | | |
|---|---|---|---|
| 6,739,744 B2 | 5/2004 | Williams et al. | |
| 6,755,547 B2 | 6/2004 | Parker | |
| 6,757,969 B1 | 7/2004 | Chan | |
| 6,786,625 B2 | 9/2004 | Wesson | |
| 6,793,371 B2 | 9/2004 | Lamke et al. | |
| 6,793,374 B2 | 9/2004 | Begemann | |
| 6,812,481 B2 | 11/2004 | Matsumura et al. | |
| 6,814,474 B2 | 11/2004 | Groeller | |
| 6,828,170 B2 | 12/2004 | Roberts et al. | |
| 6,848,818 B2 | 2/2005 | Huizenga | |
| 6,860,628 B2 | 3/2005 | Robertson et al. | |
| 6,866,394 B1 | 3/2005 | Hutchins et al. | |
| 6,874,925 B2 | 4/2005 | Page et al. | |
| 6,889,456 B2 | 5/2005 | Shibata et al. | |
| 6,899,449 B2 | 5/2005 | Hatagishi et al. | |
| 6,907,643 B2 | 6/2005 | Koops et al. | |
| 6,910,783 B2 | 6/2005 | Mezei et al. | |
| 6,919,629 B2 | 7/2005 | Mercado | |
| 6,921,926 B2 | 7/2005 | Hsu | |
| 6,930,332 B2 | 8/2005 | Hashimoto et al. | |
| 6,942,360 B2 | 9/2005 | Chou et al. | |
| 6,949,709 B1 | 9/2005 | Barat et al. | |
| 6,971,758 B2 | 12/2005 | Inui et al. | |
| 6,979,100 B2 | 12/2005 | Reiff et al. | |
| 6,982,518 B2 | 1/2006 | Chou et al. | |
| 6,988,819 B2 | 1/2006 | Siktberg et al. | |
| 6,997,576 B1 | 2/2006 | Lodhie et al. | |
| 7,040,779 B2 | 5/2006 | Lamke et al. | |
| 7,055,997 B2 | 6/2006 | Baek | |
| 7,060,542 B2 | 6/2006 | Nakajima et al. | |
| 7,070,304 B2 | 7/2006 | Imai | |
| 7,071,523 B2 | 7/2006 | Yano et al. | |
| 7,080,446 B2 | 7/2006 | Baba et al. | |
| 7,081,644 B2 | 7/2006 | Flaherty et al. | |
| 7,083,311 B2 | 8/2006 | Schreck et al. | |
| 7,086,756 B2 | 8/2006 | Maxik | |
| 7,102,213 B2 | 9/2006 | Sorg | |
| 7,114,830 B2 | 10/2006 | Robertson et al. | |
| 7,118,646 B2 | 10/2006 | Hunkeler | |
| 7,119,422 B2 | 10/2006 | Chin | |
| 7,128,442 B2 | 10/2006 | Lee et al. | |
| 7,140,751 B2 | 11/2006 | Lin | |
| 7,160,015 B2 | 1/2007 | Parker | |
| 7,172,314 B2 | 2/2007 | Currie et al. | |
| 7,175,324 B2 | 2/2007 | Kwon | |
| 7,195,381 B2 | 3/2007 | Lynam et al. | |
| 7,199,438 B2 | 4/2007 | Appelt et al. | |
| 7,213,952 B2 | 5/2007 | Iwai | |
| 7,220,029 B2 | 5/2007 | Bynum | |
| 7,224,001 B2 | 5/2007 | Cao | |
| 7,226,189 B2 | 6/2007 | Lee et al. | |
| 7,241,031 B2 | 7/2007 | Sloan et al. | |
| 7,249,869 B2 | 7/2007 | Takahashi et al. | |
| 7,262,489 B2 | 8/2007 | Shoji | |
| 7,265,322 B2 | 9/2007 | Aengenheyster et al. | |
| 7,267,407 B1 | 9/2007 | Demick et al. | |
| 7,268,368 B1 | 9/2007 | Knapp | |
| 7,270,454 B2 | 9/2007 | Amano | |
| 7,280,288 B2 | 10/2007 | Loh et al. | |
| 7,282,785 B2 | 10/2007 | Yoshida | |
| 7,301,176 B2 | 11/2007 | Abe et al. | |
| 7,333,257 B2 | 2/2008 | Reynolds et al. | |
| 7,357,525 B2 | 4/2008 | Doyle | |
| 7,374,305 B2 | 5/2008 | Parker | |
| 7,380,961 B2 | 6/2008 | Moriyama et al. | |
| 7,384,177 B2 | 6/2008 | Parker | |
| 7,384,817 B2 | 6/2008 | Takiar et al. | |
| 7,387,420 B2 | 6/2008 | Ogino et al. | |
| 7,402,270 B2 | 7/2008 | Mercado | |
| 7,434,974 B2 | 10/2008 | Parker | |
| 7,448,778 B2 | 11/2008 | Lin | |
| 7,467,887 B2 | 12/2008 | Parker | |
| 7,712,933 B2 | 5/2010 | Fleischmann | |
| 7,815,339 B2 | 10/2010 | Veenstra et al. | |
| 7,837,359 B2 | 11/2010 | Danek et al. | |
| 8,004,860 B2 * | 8/2011 | Salzman | 361/818 |
| 2002/0003700 A1 | 1/2002 | Selkee | |
| 2002/0004251 A1 | 1/2002 | Roberts et al. | |
| 2002/0089849 A1 | 7/2002 | Lamke et al. | |
| 2002/0105812 A1 | 8/2002 | Zimmermann et al. | |
| 2002/0131261 A1 | 9/2002 | Inui et al. | |
| 2003/0160256 A1 | 8/2003 | Durocher et al. | |
| 2004/0056265 A1 | 3/2004 | Arndt et al. | |
| 2004/0114367 A1 | 6/2004 | Li | |
| 2004/0180459 A1 | 9/2004 | Hsu | |
| 2004/0223328 A1 | 11/2004 | Lee et al. | |
| 2004/0252501 A1 | 12/2004 | Moriyama et al. | |
| 2004/0265512 A1 | 12/2004 | Aengenheyster et al. | |
| 2005/0007759 A1 | 1/2005 | Parker | |
| 2005/0012880 A1 | 1/2005 | Yoshii et al. | |
| 2005/0032259 A1 | 2/2005 | Nakajima et al. | |
| 2005/0039512 A1 | 2/2005 | Lefevere | |
| 2005/0117352 A1 | 6/2005 | Lin | |
| 2005/0121829 A1 | 6/2005 | Spurr et al. | |
| 2005/0200045 A1 | 9/2005 | Hunkeler | |
| 2005/0206040 A1 | 9/2005 | Mercado | |
| 2005/0207176 A1 | 9/2005 | Johnson et al. | |
| 2005/0210672 A1 | 9/2005 | Reynolds et al. | |
| 2005/0213351 A1 | 9/2005 | Yang | |
| 2005/0214968 A1 | 9/2005 | Waitl et al. | |
| 2005/0269587 A1 | 12/2005 | Loh et al. | |
| 2005/0286840 A1 | 12/2005 | Ho et al. | |
| 2006/0040094 A1 | 2/2006 | Mizuno et al. | |
| 2006/0043607 A1 | 3/2006 | Matsuura et al. | |
| 2006/0157725 A1 | 7/2006 | Flaherty | |
| 2006/0187652 A1 | 8/2006 | Doyle | |
| 2006/0198155 A1 | 9/2006 | Nickola et al. | |
| 2006/0215422 A1 | 9/2006 | Laizure, Jr. et al. | |
| 2006/0220049 A1 | 10/2006 | Flaherty et al. | |
| 2006/0239037 A1 | 10/2006 | Repetto et al. | |
| 2006/0245188 A1 | 11/2006 | Takenaka | |
| 2006/0245191 A1 | 11/2006 | Ratcliffe | |
| 2006/0274554 A1 | 12/2006 | Parker | |
| 2007/0029569 A1 | 2/2007 | Andrews | |
| 2007/0075451 A1 | 4/2007 | Winter et al. | |
| 2007/0080357 A1 | 4/2007 | Ishii | |
| 2007/0097683 A1 | 5/2007 | Chikugawa | |
| 2007/0103901 A1 | 5/2007 | Reid | |
| 2007/0103902 A1 | 5/2007 | Hsiao | |
| 2007/0117248 A1 | 5/2007 | Kunze et al. | |
| 2007/0121326 A1 | 5/2007 | Nall et al. | |
| 2007/0133214 A1 | 6/2007 | Maeda et al. | |
| 2007/0153503 A1 | 7/2007 | Feng | |
| 2007/0153549 A1 | 7/2007 | Parker | |
| 2007/0166866 A1 | 7/2007 | Appelt et al. | |
| 2007/0170454 A1 | 7/2007 | Andrews | |
| 2007/0187710 A1 | 8/2007 | Steen et al. | |
| 2007/0194333 A1 | 8/2007 | Son | |
| 2007/0194336 A1 | 8/2007 | Shin et al. | |
| 2007/0194337 A1 | 8/2007 | Kondo | |
| 2007/0196762 A1 | 8/2007 | Maeda et al. | |
| 2007/0200127 A1 | 8/2007 | Andrews et al. | |
| 2007/0205425 A1 | 9/2007 | Harada | |
| 2007/0217192 A1 | 9/2007 | Hiratsuka | |
| 2007/0241357 A1 | 10/2007 | Yan | |
| 2007/0241362 A1 | 10/2007 | Han et al. | |
| 2007/0257398 A1 | 11/2007 | Moncrieff | |
| 2007/0259576 A1 | 11/2007 | Brandt et al. | |
| 2007/0274648 A1 | 11/2007 | Ip | |
| 2008/0062711 A1 | 3/2008 | Veenstra et al. | |
| 2008/0066355 A1 | 3/2008 | Misawa et al. | |
| 2008/0076859 A1 | 3/2008 | Eipper et al. | |
| 2008/0102726 A2 | 5/2008 | Jeganathan et al. | |
| 2008/0106187 A1 | 5/2008 | Suzuki et al. | |
| 2008/0170405 A1 | 7/2008 | Kamiya et al. | |
| 2008/0259642 A1 | 10/2008 | Parker | |
| 2009/0297090 A1 | 12/2009 | Bogner et al. | |

FOREIGN PATENT DOCUMENTS

| | | |
|---|---|---|
| DE | 3916875 A1 | 12/1990 |
| DE | 298 11 417 U1 | 10/1998 |
| DE | 198 05 771 A1 | 8/1999 |
| DE | 102005/048497 | 4/2007 |
| EP | 1657758 | 8/1999 |
| GB | 2431764 | 5/2007 |
| JP | 1988 63292690 | 11/1988 |
| JP | 1990 2058892 | 2/1990 |
| JP | 09-129077 | 5/1997 |

| | | |
|---|---|---|
| JP | 1999 11220239 | 8/1999 |
| JP | 2002096680 | 4/2002 |
| JP | 2002287671 | 10/2002 |
| JP | 2003-243712 | 8/2003 |
| JP | 2005134789 | 5/2005 |
| JP | 2005221661 | 8/2005 |
| JP | 2006062431 | 3/2006 |
| JP | 2007/203873 | 8/2007 |
| JP | 2008070697 | 3/2008 |
| KR | 2000/0009857 | 2/2000 |
| TW | 2007/02591 | 1/2007 |
| WO | 97/48134 | 12/1997 |
| WO | 97/50132 | 12/1997 |
| WO | 00/55685 | 9/2000 |
| WO | 00/55914 | 9/2000 |
| WO | 2006059828 A1 | 6/2006 |
| WO | 2007/036207 | 4/2007 |
| WO | 2007/064701 | 6/2007 |
| WO | 2008/024761 | 2/2008 |
| WO | 2009/075924 | 6/2009 |
| WO | 2009/076579 | 6/2009 |

OTHER PUBLICATIONS

International Search Report dated Jul. 23, 2009 for Int'l Application No. PCT/US2008/086521, Int'l Filing Date Dec. 12, 2008.

Korean Intellectual Property Office, "International Search Report", International Application No. US2008/086521 Jul. 23, 2009 (3 pages).

Howstuffworks, "Inside a Light Emitting Diode," 2002 (1 page).

"International Search Report", International Application No. PCT/US2008/076859, filed Sep. 18, 2008 (4 pages).

European Patent Office, "Supplementary European Search Report", Jan. 19, 2001 (6 pages).

* cited by examiner

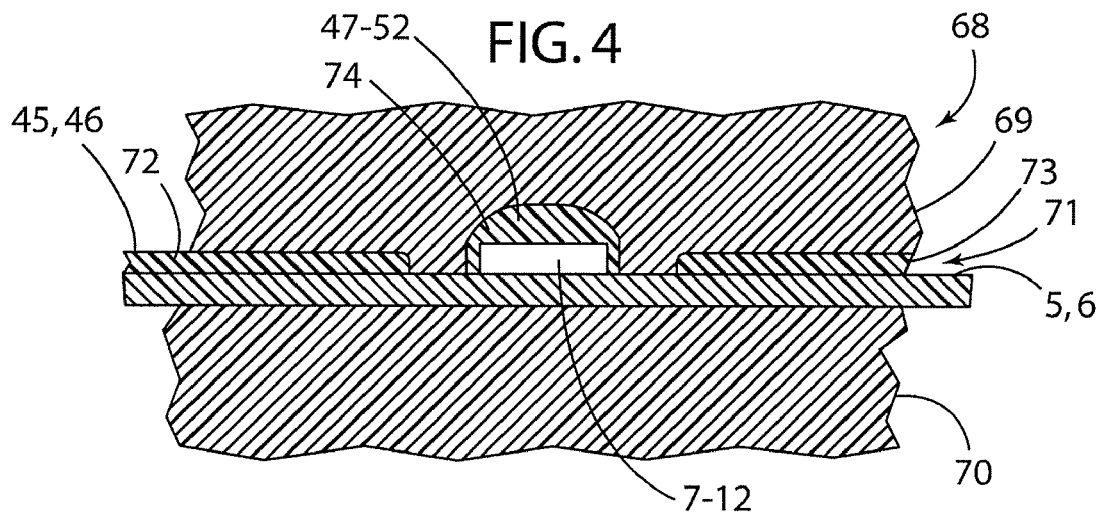
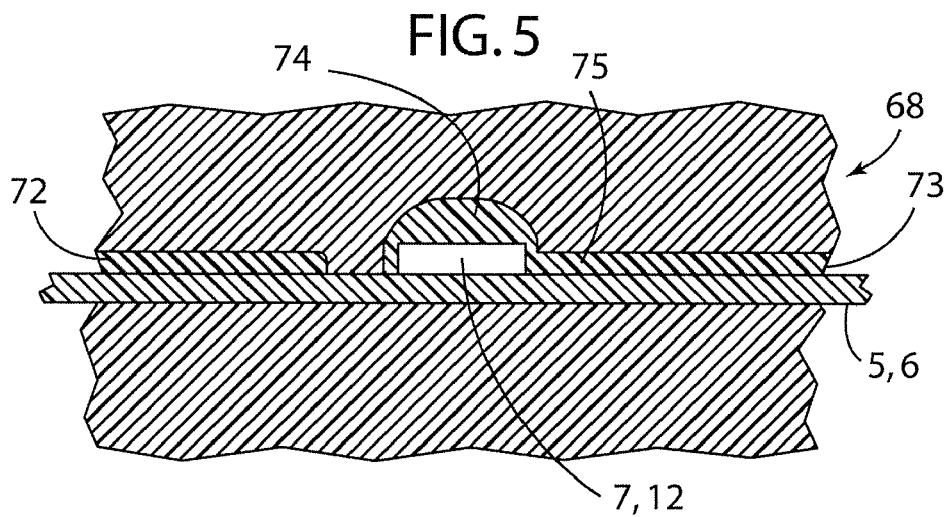
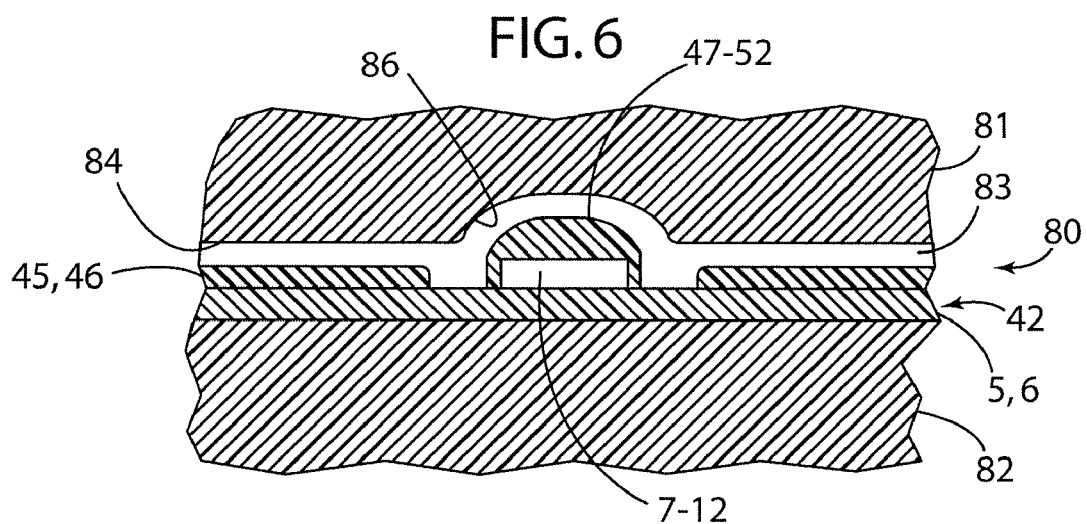

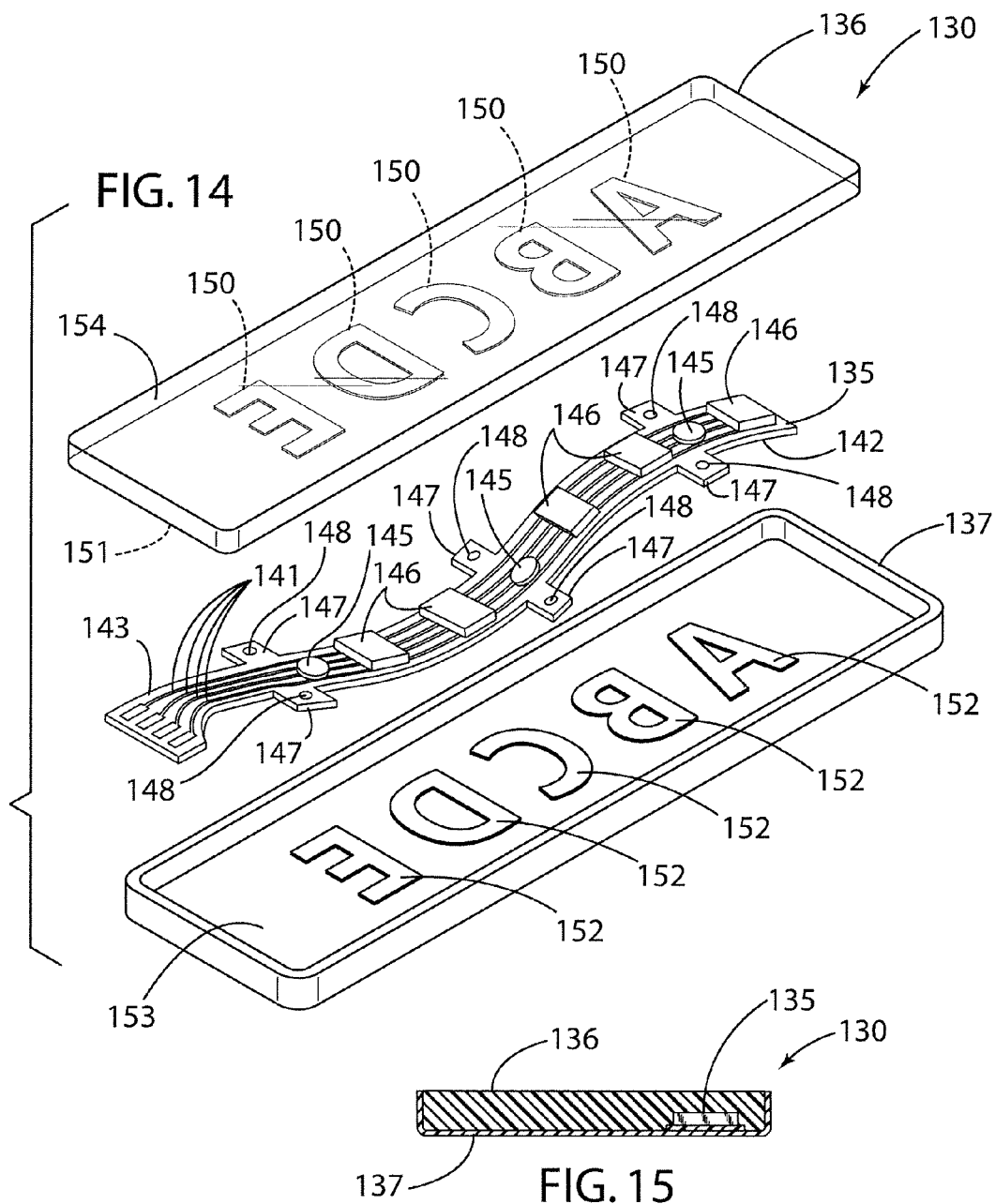

OVERMOLDED CIRCUIT BOARD AND METHOD

CROSS REFERENCE TO RELATED APPLICATION

This application claims the benefit of U.S. Provisional Application No. 61/013,097, filed on Dec. 12, 2007, entitled OVERMOLDED CIRCUIT BOARD AND METHOD, the entire contents of which are incorporated herein by reference.

BACKGROUND OF THE INVENTION

Circuit boards have been utilized in a very wide range of applications for physically and electrically interconnecting various electrical components such as integrated circuits ("chips"), LEDs, resistors, capacitors, inductors, and the like to form electrical circuits. Circuit boards may include a substrate board made of a nonconductive material, and a plurality of conductors disposed one or both sides of the board to form a circuit. Circuit boards may comprise printed circuit boards (PCBs), printed wiring boards (PWBs), or other such technologies. Circuit boards may be mounted in an internal space of a housing or the like if required for a particular application.

BRIEF DESCRIPTION OF THE DRAWINGS

FIG. 4 is a cross sectional view taken along the line IV-IV, FIG. 3, showing the component in a mold tool during fabrication.

FIG. 5 is a cross sectional view taken along the line V-V, FIG. 3, showing the component in a mold tool during fabrication; FIG. 3;

FIG. 6 is a cross sectional view showing the components of FIG. 3 positioned in a second mold tool cavity immediately prior to injection of a second shot of molten polymer material;

FIG. 14 is an exploded isometric view of an electrical device according to another aspect of the present invention;

FIG. 15 is a cross-sectional view of the electrical device of FIG. 14;

FIG. 23;

DETAILED DESCRIPTION OF PREFERRED EMBODIMENT

Figure 3:
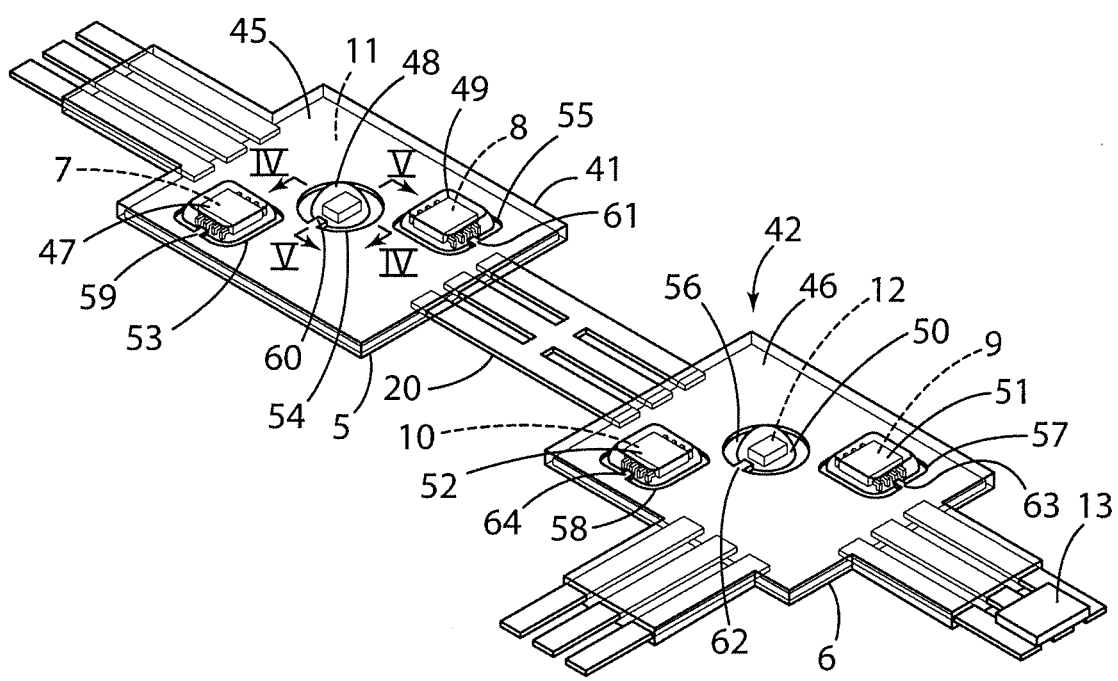
FIG. 3 is an isometric view showing the components of FIG. 2 during fabrication of the device of FIG. 1.

For purposes of description herein, the terms "upper," "lower," "right," "left," "rear," "front," "vertical," "horizontal," and derivatives thereof shall relate to the invention as oriented in FIGS. 3 and 4. However, it is to be understood that the invention may assume various alternative orientations and step sequences, except where expressly specified to the contrary. It is also to be understood that the specific devices and processes illustrated in the attached drawings and described in the following specification are simply exemplary embodiments of the inventive concepts. Hence, specific dimensions and other physical characteristics relating to the embodiments disclosed herein are not to be considered as limiting.

Figure 1:
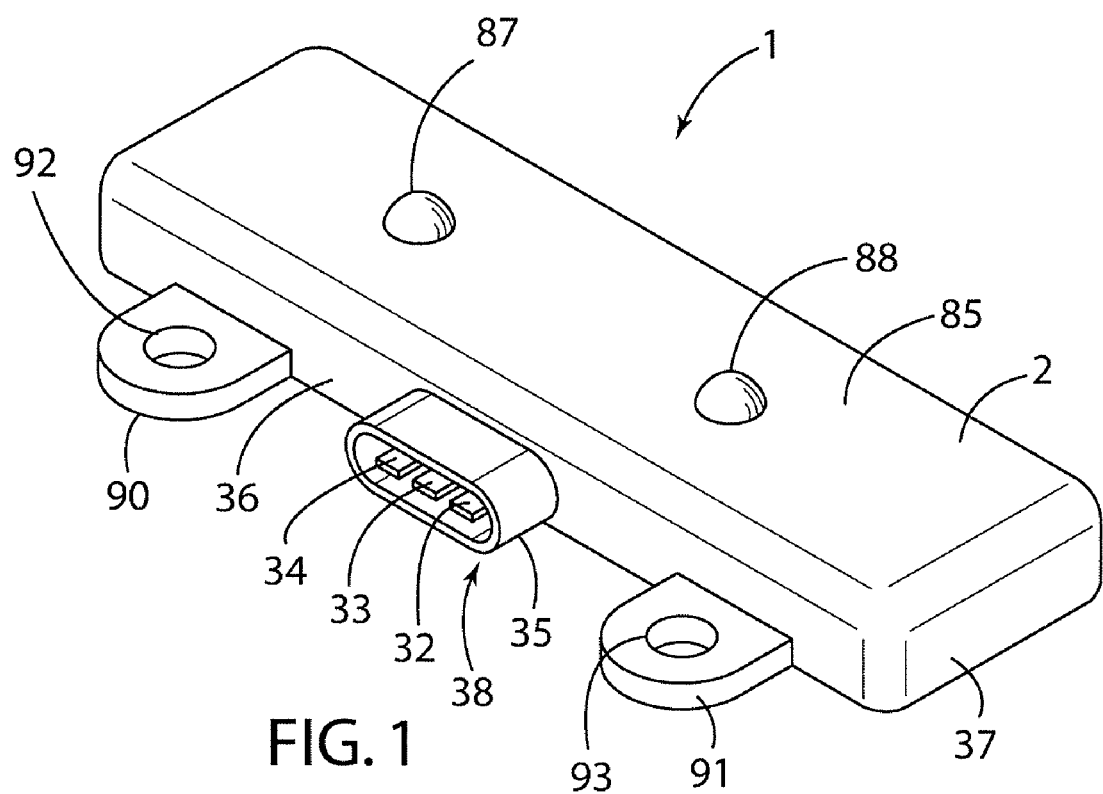
FIG. 1 is an isometric view of an electrical device according to one aspect of the present invention.
Figure 2:
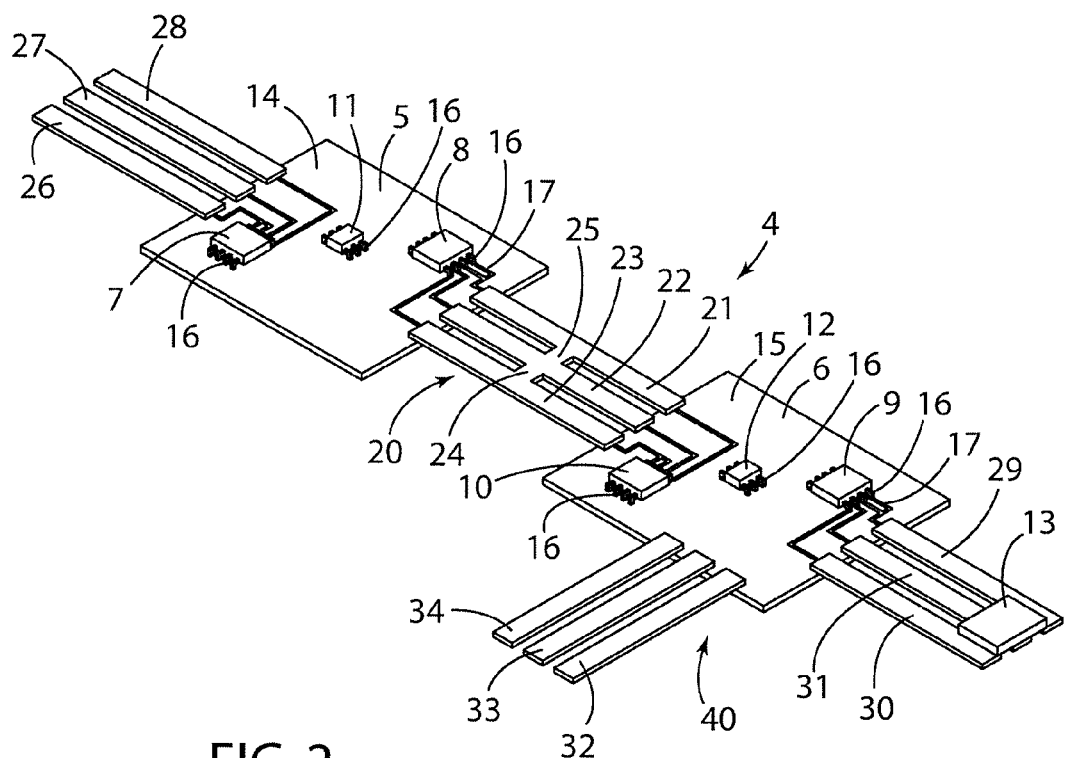
FIG. 2 is an isometric view showing internal components of the device of FIG. 1.

An electrical device 1 (FIG. 1) includes an outer portion 2 formed from polymer material or the like that encapsulates internal electrical components 4 (FIG. 2). The internal electrical components 4 may include one or more printed circuit boards 5 and 6 ("PCBs"), and one or more integrated circuits ("IC chips") 7-10 and/or one or more LEDs 11-13. In the illustrated example, the IC chips 7-10 may comprise microprocessors, light sensors, temperature sensors, or other electrical devices or components, and the LEDs 11 and 12 may comprise red-green-blue ("RGB") LEDs. The IC chips 7-10 and LEDS 11-12 may be soldered or otherwise connected to the surfaces 14 and 15 of PCBs 5 and 6, respectively. Alternately, conductive epoxy, adhesives, or the like, may also be utilized to secure the IC chips 7-10 and LEDs 11-12 to the PCBs 5 and 6. The IC chips 7-10 and LEDs 11-12 may include a plurality of leads 16 that are electrically and mechanically connected to conductive material 17 on the surfaces 14 and 15 of PCBs 5 and 6, respectively. The PCBs 5 and 6 may be constructed according to known methods, and the various electrical components such as the IC chips 7-10 and LEDs 11-12 may be connected to the conductive material 17 utilizing known methods and materials. In addition to the IC chips 7-10 and LEDs 11-12, a variety of other electrical components 18 may also be secured to the conductive material 17 of the PCBs 5 and 6 if required for a particular application. The electrical components 18 may comprise resistors, capacitors, diodes, transistors, photosensors, inductors, or other such electrical devices or components.

The PCBs 5 and 6 may be interconnected by a conductor 20 having a plurality of elongated sections 21-23 that are initially interconnected by transverse sections 24 and 25. The elongated sections 21-23 may be connected to the surfaces 14 and 15 of the PCBs 5 and 6 by soldering or other suitable electrical and mechanical connection. The conductor 20 is initially fabricated as a 1-piece member, and the transverse sections 24 and 25 are later cut to form three separate elongated sections 21-23. The number of elongated sections 21-23 utilize for a particular application may vary as required.

In addition to the conductor 20, additional conductors 26-34 may also be connected to the PCBs 5 and 6. The conductors 26-34 may be formed from relatively rigid stamped sheet metal such as brass or copper. Alternately, the conductors 26-34 may comprise wires, rails, ribbon cables, or other flexible members, depending upon the requirements of a particular application. With reference back to FIG. 1, outer portion 2 of electrical device 1 may include a portion 35 that extends outwardly from a side face 36 of body portion 37 of outer portion 2 to form, with conductors 32-34, an electrical receptacle 38 that can be coupled to a source of electrical power utilizing a standard connection. Referring again to FIG. 2, the electrical device 1 may include one or more electrical components such as a white LED 13 that are connected directly to conductors 29-31.

After the electrical components such as the IC chips, LEDs 11-12, and/or other components (not shown), and the conductors 20 and 26-34 are secured to the PCBs 5 and 6 via soldering or the like to form an assembly 40 (FIG. 2), the assembly 40 is positioned in a mold tool 68 (FIGS. 4 and 5), and a polymer material 41 is molded onto the assembly 40 to form an intermediate assembly 42 (FIG. 3). The polymer material 41 forms layers of polymer 45 and 46 on upper surfaces 14 and 15 of PCBs 5 and 6, respectively. Capsule portions 47-52 are molded over the top of the IC chips 7-10 and LEDs 11-12, respectively. Similar capsule portions (not shown) may also be formed over the electrical components 18. Channels or grooves 53-58 extend around the capsule portions 47-52, and small plastic bridges 59-64 extend between the layers of polymer 45 and 46 and the capsule portions 47-52. As discussed in more detail below, the bridges 59-64 result from small passageways in the mold cavity that supply molten polymer material from the cavity portions forming the layers of polymer 45 and 46, and the mold cavity portions forming the capsule portions 47-52 over the IC chips 7-10 and LEDs 11-12. Capsule portions, channels, and bridges are also formed around the other electrical components 18 (FIG. 2). However, for clarity, these features are not shown in FIG. 3. The polymer material 41 preferably has a melting temperature that is lower than the materials utilized to form PCBs 5 and 6 and any of the other components utilized to form assembly 40.

With further reference to FIG. 4, the mold tool 68 utilized to form the intermediate assembly 42 of FIG. 3 includes a first mold part 69 and a second mold part 70. The PCBs 5 and 6 are positioned in mold cavity 71, and molten polymer material is injected into mold cavity portions 72-74 to form the layers 45 and 46, and the capsule portions 47-52 around I.C. chips 7-10, LEDs 11-13, and electrical components or devices 18.

As shown in FIG. 5, a small passageway 75 fluidly interconnects cavity portion 73 with cavity portion 74 to thereby provide for flow of molten material from the cavity portion 73 into the cavity portion 74 to thereby form the capsule portions 47-52. The passageway 75 also fills with molten polymer material, thereby forming the bridge portions 59-64 (FIG. 3) interconnecting the capsule portions 47-52 with the layers 45 and 46 of PCBs 5 and 6, respectively. The passageway 75 has a very small cross sectional area, such that the flow of molten material into the cavity portion 74 around the electrical components 7-12 and 18 is restricted. Although the size of passageway 75 may vary depending upon the size of the electrical component being encapsulated, the type of polymer material being molded, or other variables, the cross sectional area of passageway 75 is generally about 0.004 inches$^2$, and typically falls in a range of about 0.002 inches$^2$ to about 0.050 inches². However, the cross sectional area of passageway 75 may fall outside this range, and the cross sectional area of passageway 59 may be as great as 0.100 inches², 0.25 inches², or more, or it may be as small as 0.001 inches² or less. In this way, the electrical components 7-12 and 18 are not subjected to the pressures and forces that would otherwise occur if the entire outer portion 2 of device 1 (FIG. 1) were to be molded in a single mold shot process. By isolating the electrical components 7-12 and 18 from the full force and/or heat that would otherwise be produced by the molten polymer being injected into the mold cavity if a single shot mold process were utilized, the electrical components 7-12 and 18 are substantially protected such that the components are not dislodged from the PCBs 5 and 6 and/or the conductors 26-34.

With further reference to FIG. 6, after the intermediate assembly 42 is formed in a first mold shot in mold tool 68, the intermediate assembly 42 is then placed in a cavity 83 of a second mold tool 80 having a first mold part 81 and second mold part 82. The PCBs 5 and 6 and/or the conductors 26-34 may include one or more apertures or other locating features (not shown) that engage pins or other such components (also not shown) of mold tools 68 and 80 to thereby position the assemblies 40 and 42 in the mold tools 68 and 80, respectively. Cavity 83 of second mold tool 80 may have an inner surface 84 that substantially corresponds to outer surface 85 of electrical device 1 (FIG. 1). Molten polymer is injected into the cavity 83 over the layers 45 and 46 previously molded onto PCBs 5 and 6. The molten polymer material injected into cavity 83 also encapsulates the capsule portions 47-52 previously formed in mold tool 68. Cavity 83 may include a concave surface 86 that forms protrusions 87 and 88 (FIG. 1) over the LEDs 11 and 12 to thereby form lenses that distribute light in a predefined pattern. The polymer material utilized to form the outer portion 2 of device 1 may be transparent, or it may be colored to provide a specific appearance. The mold tool and process utilized to form the capsules 47-52 is similar to the tooling and process described in detail in U.S. patent application Ser. No. 11/842,606, filed on Aug. 21, 2007, (now U.S. Patent Application Publication No. US 2008/0062711) the entire contents of which are incorporated by reference. Depending upon the size and shape of the device 1 and/or other variables, additional molding steps or shots may be utilized. For example, in some situations the size and/or geometry of the body portion 37 of device 1 may not permit molding in a second mold tool 80 (FIG. 6). In this case, mold tool 80 could include a cavity that forms another intermediate assembly and a third mold tool (not shown) would be utilized to mold the final body 37 of device 1. If required for a particular application, additional mold tools and mold shots may also be utilized to form the device 1.

In addition to the electrical components mounted to the PCBs 5 and 6, one or more additional electrical components or devices such as a white LED 13 and/or other electrical components (not shown) may be mounted directly to one or more of the conductors 26-34, and these components may also be encapsulated and overmolded in a two-shot process that is substantially similar to the process described in detail in U.S. Patent Application Publication No. 2008/0062711. The mold tools 68 and 80 may include portions for encapsulating components mounted to PCBs 5 and 6 as described in detail above, and the same mold tools 68 and 80 may include other cavity portions that simultaneously encapsulate components such as white LED 13 that are mounted to conductors 26-34 in substantially the same manner as described in detail in U.S. Patent Application Publication No. 2008/0062711.

Referring again to FIG. 1, the polymer outer portion 2 may include integrally formed mounting features such as extensions 90 and 91 having openings 92 and 93, respectively, which receive fasteners or the like to secure the electrical device 1. Alternately, other mounting features such as bosses, apertures for mechanical fasteners, and the like (not shown), may be formed on outer portion 2 to locate and/or mount electrical device 1. Also, it will be understood that the conductors 20 and/or 26-34 do not necessarily need to be formed in a planar configuration. The conductors may be formed into a variety of three-dimensional, non-planar configurations, such that the circuit boards 5 and 6 may be positioned in a non-planar configuration relative to one another. In this way, the overall shape of the electrical device 1 may be non-planar as required for a particular application. For example, if device 1 comprises a light that must fit into a restricted space, the number and size of the PCBs, as well as the orientation and location of the PCBs relative to one another, may be chosen to fit closely within the confined area. In this way, a plurality of LEDs or other electrical components may be included in device 1, and the LEDs or other electrical components may be mounted to a PCB providing the proper electrical connections for the LEDs or other components, without the electrical device 1 being limited as it would be if a single large PCB were utilized to mount all of the components.

Also, because the PCBs and other electrical components are completely encapsulated in polymer material, these internal components are sealed such that they are not exposed to atmospheric moisture and other elements. Accordingly, the device 1 is very durable and weather-resistant, such that it may be utilized to provide for exterior lighting for vehicles, building structures, or the like. Still further, the various electrical components that may be needed to form one or more electrical circuits that provide the required electrical power to the LEDs and/or other internal components may also be connected to the PCBs or other internal conductors. In this way, a conventional 12-volt DC power source may be connected to the electrical receptacle 38 (FIG. 1), and the electrical components mounted to the PCBs 5 or 6 and/or to the conductors 26-34 may be utilized to provide the proper voltage and current to the LEDs and/or other components. Thus, if device 1 comprises, for example, a light for a vehicle having a 12 volt DC power system, the device may be connected directly to the vehicles 12 volt wiring harness as a direct replacement for a conventional incandescent light.

According to one aspect of the present invention, one of the IC chips 7-10 (or electrical components 18) may comprise a light intensity sensor that turns on one or more of the LEDs 11-13 if the device 1 is exposed to sufficiently low light conditions. The electrical device 1 may comprise a lighted badge or emblem that can be secured to an outer surface of a motor vehicle or the like. If the device 1 includes sensors that are molded into the device 1, the badge or emblem may be configured to be automatically illuminated when the vehicle is exposed to low-light conditions.

Figure 6A:
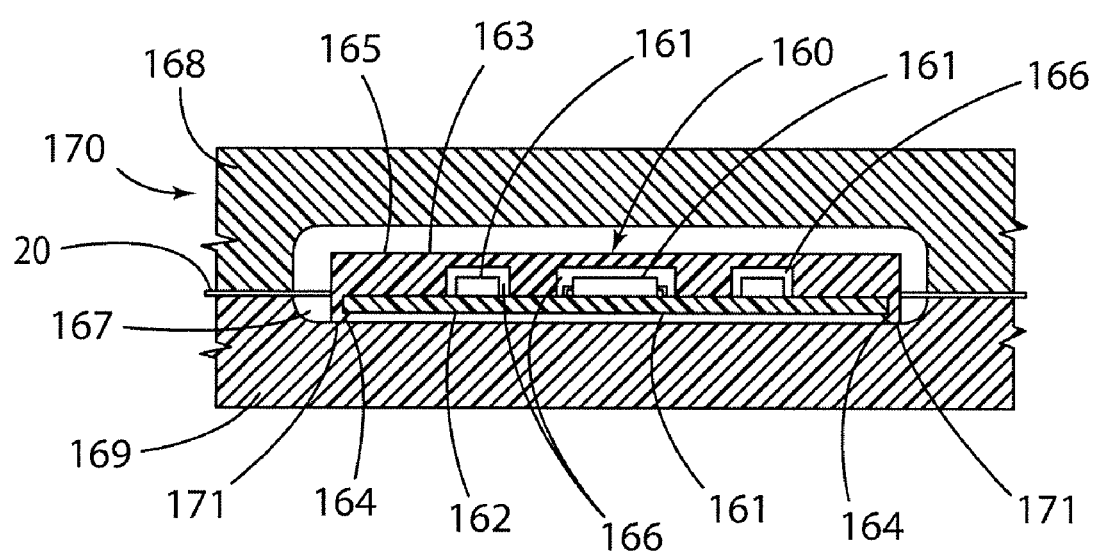
FIG. 6A is a partially fragmentary cross-sectional view of an electrical device and fabrication process according to another aspect of the present invention.

With further reference to FIG. 6A, an electrical device 160 according to another aspect of the present invention may be fabricated utilizing the tool/process illustrated in FIG. 6A. A plurality of electrical devices 161 and conductors 20 may be soldered or otherwise secured to a printed circuit board 162. A pre-formed polymer cover 163 is then secured to the printed circuit board utilizing tapered snap-type connecting portions 164 to form an intermediate assembly 165. Cover 163 is preferably molded of a thermoplastic polymer material, but it may comprise other materials such as thermosetting polymers or other suitable materials. The cover 163 may include one or more cavities 166 around the electrical devices 161. The cavities 166 are preferably somewhat larger in size than the electrical devices 161 to provide clearance to account for variations in the location of the electrical devices 161. The intermediate assembly 165 is then positioned in a mold cavity 167 formed by mold parts 168 and 169 of mold tool 170. The pre-molded component 163 may include support surfaces 171 that support the assembly 165 in the mold cavity 167. Molten thermoplastic polymer material is then injected into the mold cavity 167 to form a finished part. The pre-molded cover 163 provides protection for the electrical devices 161 during the molding operation. The device 160 formed by the tool and process of FIG. 6A may include cavities or air spaces around the electrical devices 161.

Figure 7:
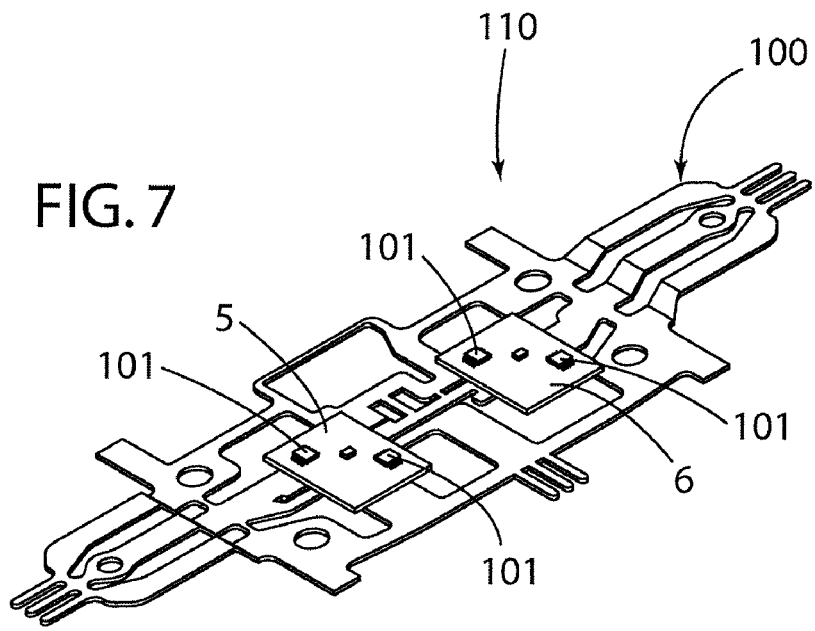
FIG. 7 is an isometric view of an assembly utilized during fabrication of a device according to another aspect of the present invention.
Figure 8:
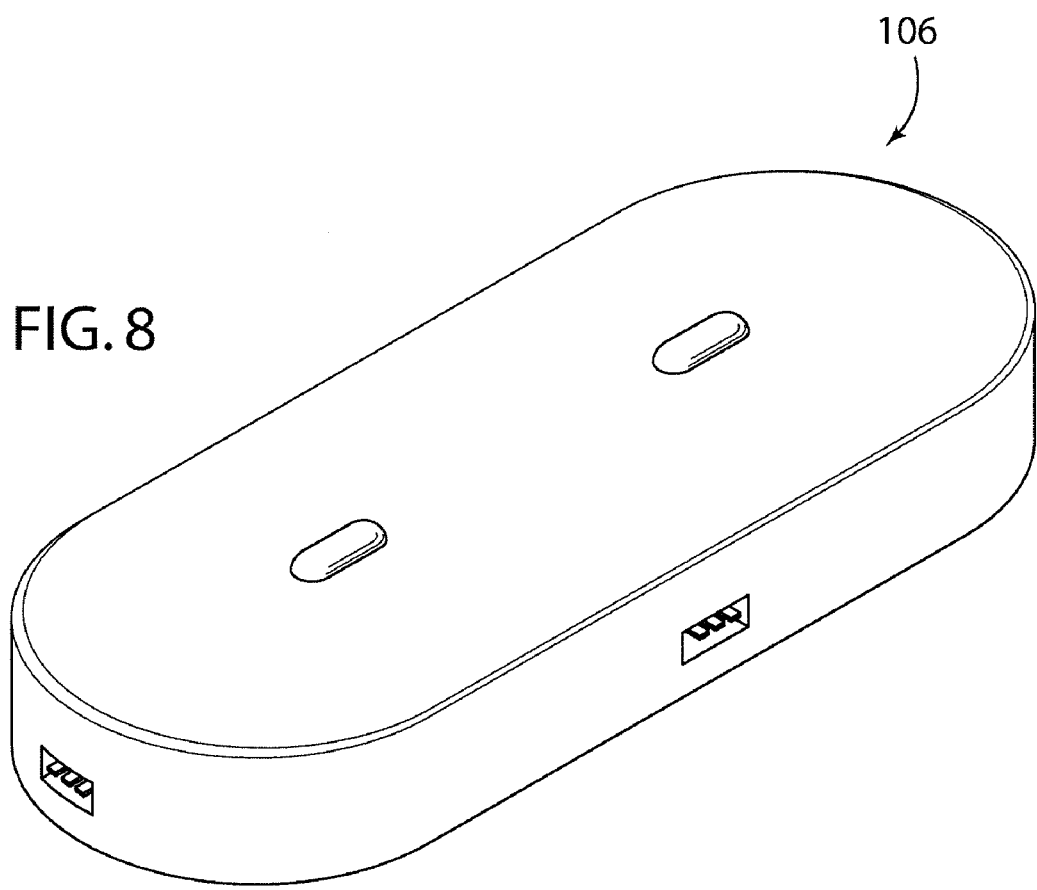
FIG. 8 is an isometric view of a finished device including the assembly of FIG. 7.
Figure 9:
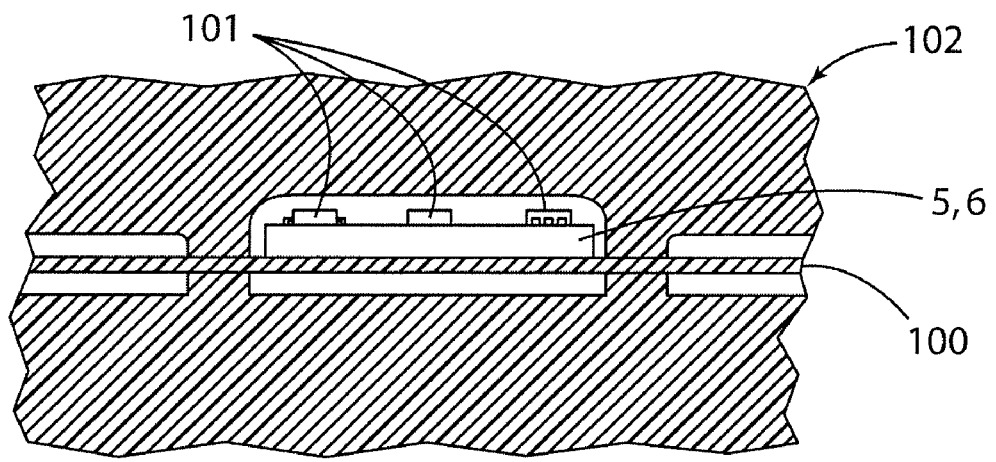
FIG. 9 is a cross-sectional view of the assembly of FIG. 7 positioned in a mold tool prior to injection of molten polymer material during a first molding shot.
Figure 10:
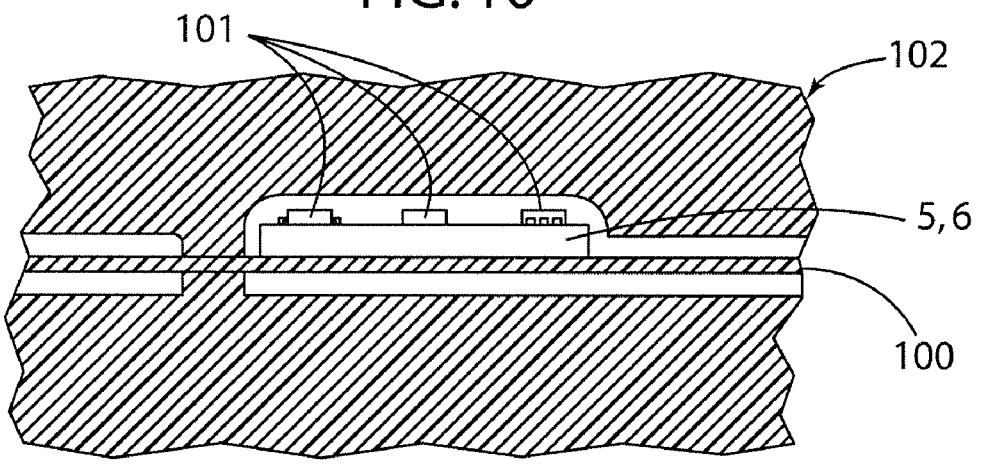
FIG. 10 is a cross-sectional view of the assembly of FIG. 7 positioned in the mold tool of FIG. 9 prior to injection of molten polymer material during a first molding shot, wherein the section line is taken across a different plane than that of FIG. 9.
Figure 11:
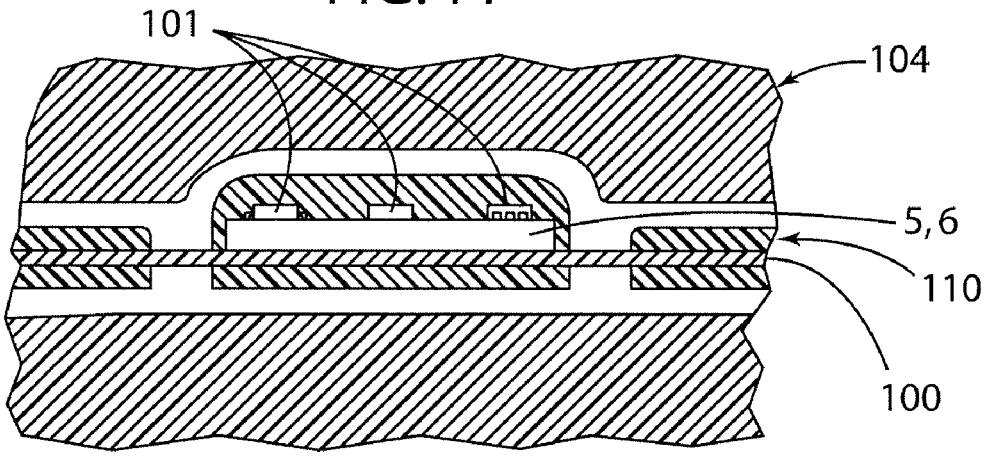
FIG. 11 is a cross-sectional view of an assembly formed by a first mold shot positioned in a mold tool according to yet another aspect of the present invention.

With further reference to FIG. 7, according to another aspect of the present invention, the PCBs 5 and 6 may be initially mounted to a single large conductive circuit element or web 100 that is formed from stamped sheet metal or the like. The conductive circuit element 100 may include a plurality of conductive portions that are initially interconnected by transverse sections such as the transverse sections 24 and 25 (FIG. 2) that are cut after the PCBs are attached to the conductive circuit element 100. The PCBs 5 and 6 may be connected to the conductive circuit element 100 utilizing soldering or other known methods. Various electrical components such as LEDs, IC chips, resistors, or the like, may be secured to the PCBs by soldering or the like, and additional electrical components may be secured directly to the conductive web via soldering or the like. The resulting assembly 110 is then overmolded in a two-shot (or more) process wherein capsule portions are first molded around the electrical components 101 in first mold tool 102 as shown in FIGS. 9 and 10 in a manner similar to the process as described in more detail above in connection with FIGS. 2-6 to form an intermediate assembly including capsule portions surrounding the electrical components in a manner that is substantially similar to the arrangement described above in connection with FIG. 3. A second mold tool 104 (FIG. 11) may then be utilized to form a device 106 (FIG. 8). One or more additional molding shots may then be applied using additional mold tools to provide a finished part that may have an exterior configuration that is substantially similar to electrical device 1 (FIG. 1).

Figure 12:
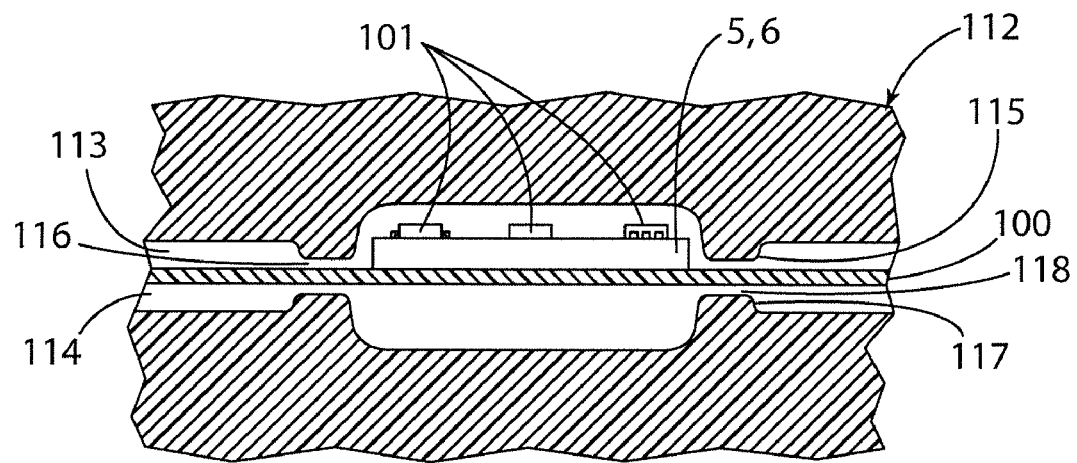
FIG. 12 is a cross-sectional view of a mold tool and electrical device according to another aspect of the present invention.

With further reference to FIG. 12, assembly 110 (FIG. 7) may, alternately, be placed in a mold tool 112 during a first mold step or shot. Mold tool 112 includes an upper cavity 113 and an optional lower cavity 114. Upper cavity 113 includes a ring-like ridge or protrusion 115 that forms a small gap 116 around components 101. The gap 116 restricts the flow of molten polymer material around PCBs 5 and 6, and around components 101 during the first molding shot. The gap 116 thereby provides for a reduced flow of molten polymer material such that a small passageway 75 (FIG. 5) is not required for mold tool 112. Mold tool 112 may, optionally, include a lower cavity 114 having a ring-like protrusion 117 forming a small gap 118 to restrict the flow of molten polymer material in the region of the PCBs 5 and 6 on the opposite side of circuit element 100.

Figure 13:
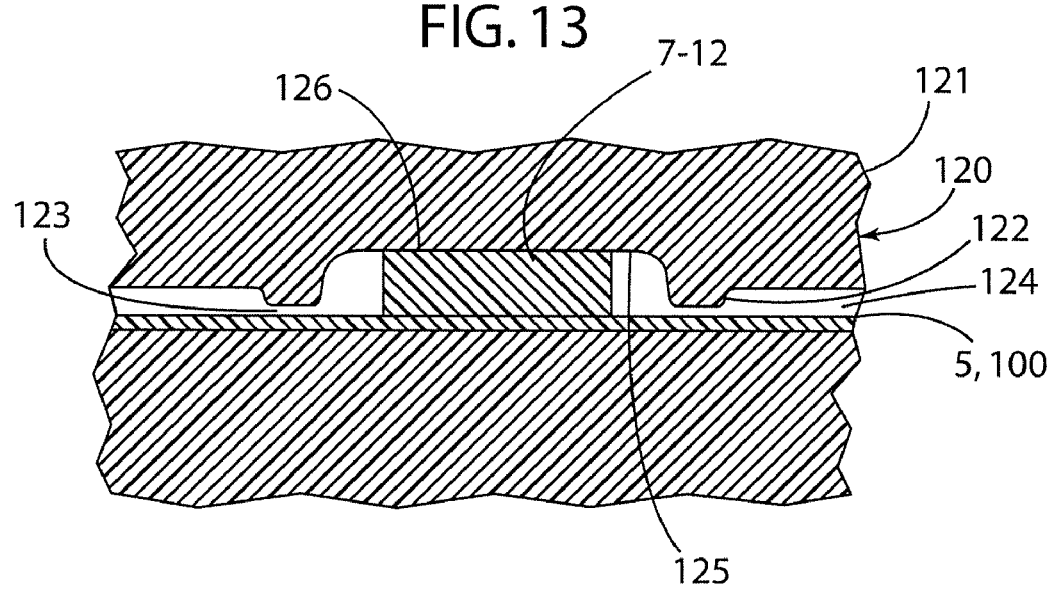
FIG. 13 is a cross-sectional view of a mold tool and electrical device according to yet another aspect of the present invention.

With further reference to FIG. 13, a mold tool 120 forms a cavity 124 and includes an upper tool part 121 having a ring-like ridge or protrusion 122 forming a small gap 123 to restrict the flow of molten polymer material around an electrical component 7-12 mounted to a PCB 5 (or to a circuit element 100). Surface 125 of mold part 121 fits tightly against electrical component 7-12, such that the electrical components of the intermediate part produced by a first mold shot or step in tool 120 are surrounded by a raised ridge of polymer material, with the upper surface 126 of the components 7-12 being exposed.

The intermediate parts produced by the mold tool 112 (FIG. 12) and the mold tool 120 (FIG. 13) may be positioned in a second mold tool such as mold tool 80 (FIG. 6), or mold tool 104 (FIG. 11) to provide for second (or more) mold shots to form a finished device.

With further reference to FIGS. 14 and 15, an electrical device 130 according to another aspect of the present invention includes an internal assembly 135, a polymer portion 136, and a backing member 137. The internal assembly 135 comprises a flexible member 140 including a flexible substrate 142, and a plurality of conductive wires or strips 141. In the illustrated example, the conductive wires or strips 141 are disposed on upper surface 143 of flexible substrate 142. However, the conductive wires or strips 141 may also be imbedded in the material forming the flexible substrate 142. In general, the conductive wires or strips 141 may be made of copper or other conductive material, and the flexible substrate may be made from a flexible material that is non-conductive. The flexible member 140 may comprise a commercially available "ribbon cable", or it may be fabricated to provide the required configuration of conductive wires or strips 141 for a particular application.

One or more LEDs 145 and/or other electrical component or devices 146 may be soldered or otherwise electrically and mechanically secured to the flexible member 140 utilizing solder, conductive adhesive, mechanical connectors, or other known technologies. The flexible substrate 142 may initially include a plurality of tabs 147, each of which includes an aperture 148.

During production, after the LEDs and/or other electrical components 146 are secured to the flexible member 140, the flexible member 140 is positioned in a first mold tool that may be substantially similar to the mold tool 68 of FIGS. 4 and 5 or the mold tool 102 of FIGS. 9 and 10, depending upon the configuration of the flexible member 140. If the electrical devices 145 and 146 comprise LEDs, transistors, resistors, compositors, or the like, a mold tool that is substantially similar to the mold tool 68 (FIGS. 4 and 5) may be utilized to form capsule portions over the electrical devices 145 and 146. Alternately, if the electrical components 146 comprise printed circuit boards, a mold tool that is substantially similar to the mold tool 102 (FIGS. 9 and 10) may be utilized to form capsule portions over the electrical components 146 and additional electrical devices (not shown) attached to the PCBs. The mold tool includes pins or other locators (not shown) that are received in apertures 148 in tabs 147 to thereby position the flexible member 140 in the mold tool. The first mold tool may include a cavity portion (not shown) that forms polymer body portions that can be utilized to locate and support the intermediate assembly after the first mold shot, and the tabs 147 may be severed tin the first mold tool, or after the part exists the first mold tool. The polymer locating features could be, for example, polymer tabs having a shape that is substantially similar to tabs 147, and including apertures. These locating features may be utilized during a second or third mold shot to locate the part after the tabs 147 are cut off. The flexible member 140 may be supported in a substantially planar shape in the first mold tool, and a layer of polymer material may be molded on a lower side of flexible member 140 to thereby form a rigid or semi-rigid intermediate assembly. Also, if required for a particular application, flexible member 140 may be supported in a curved or other non-planar configuration in the first mold tool. Also, the polymer portion 136 and/or baking member 137 may have a curved or other non-planar configuration if required for a particular application. For example, upper surface 154 of polymer portion 136 may have a convex or concave shape, or it may have planar and curved portions, and/or stepped portions (e.g. planar portions extending transversely relative to one another).

Additional molding shots utilizing a second mold tool that may be substantially similar to the mold tool 80 (FIG. 6) or the second mold tool 104 (FIG. 11) to form the polymer portion 136. In this way, the internal assembly 135 is embedded in the polymer portion 136 as shown in FIG. 15.

The polymer portion 136 may include surface portions 150 on a lower side 151 of polymer portion 136. The surface portions 150 may have a rough or otherwise irregular surface to defuse light emitted from the LEDs 145 to form a word, symbol, or the like. An upwardly facing surface 153 of backing member 137 may include a plurality of reflective portions 152 having a shape and size corresponding to the surface portions 150. The reflective portions 152 thereby reflect light generated by LEDs 145 upwardly into the surface portions 150 of polymer portion 136.

In the illustrated example, the electrical device 130 comprises a portion of a lighted door sill for vehicles and the like. The backing member 137 may have a shape and size corresponding to the upwardly-facing portion of a door sill, such that the electrical device 130 forms an integral part of the door sill of the vehicle.

Figure 16:
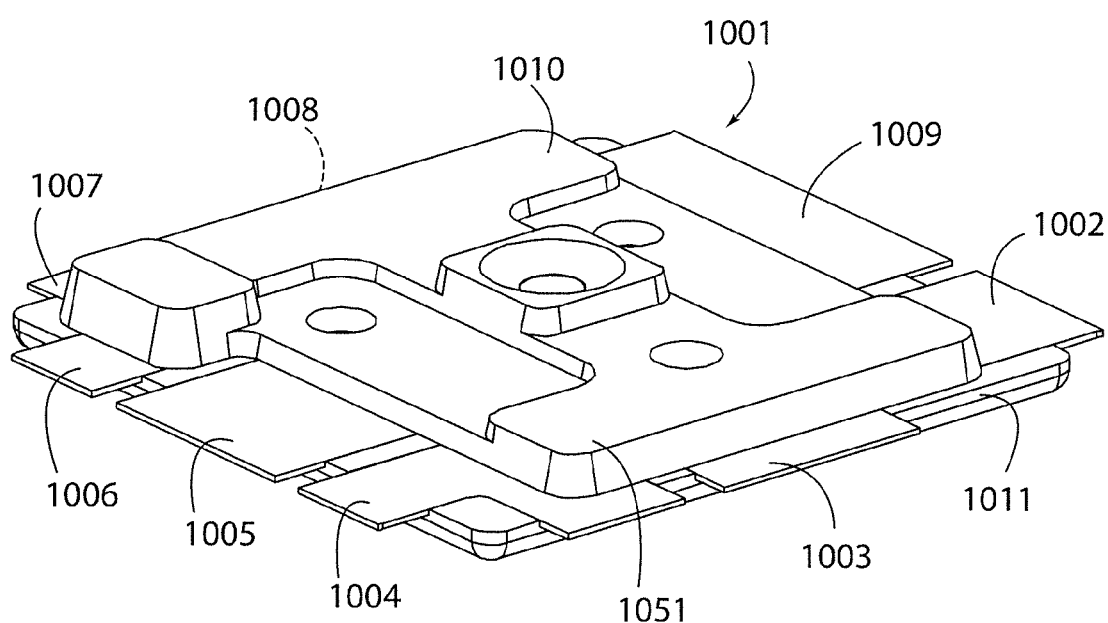
FIG. 16 is an isometric view of a finished part according to another aspect of the present invention.
Figure 17:
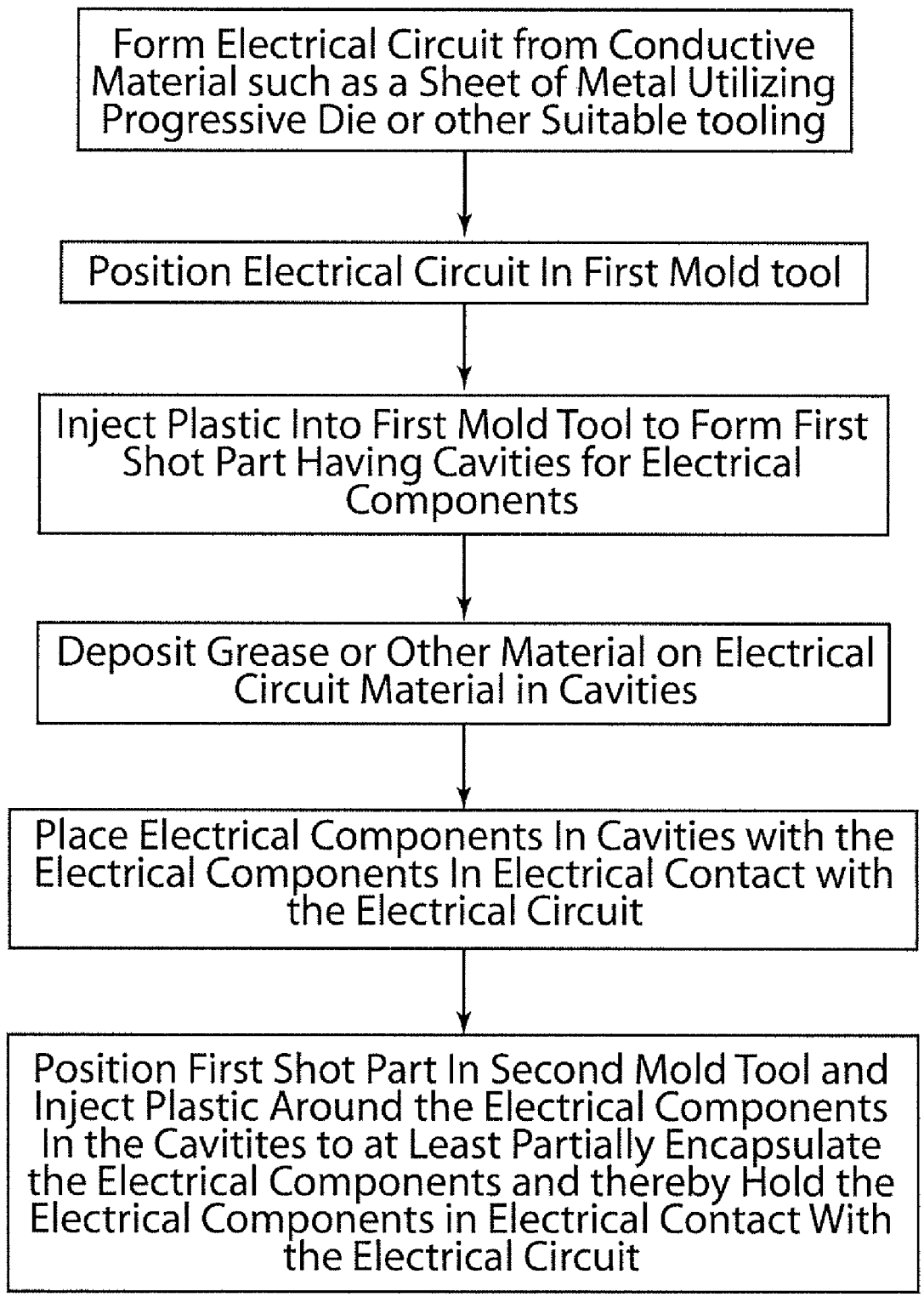
FIG. 17 is a flow chart showing the process of making the electrical device of FIG. 16.
Figure 18:
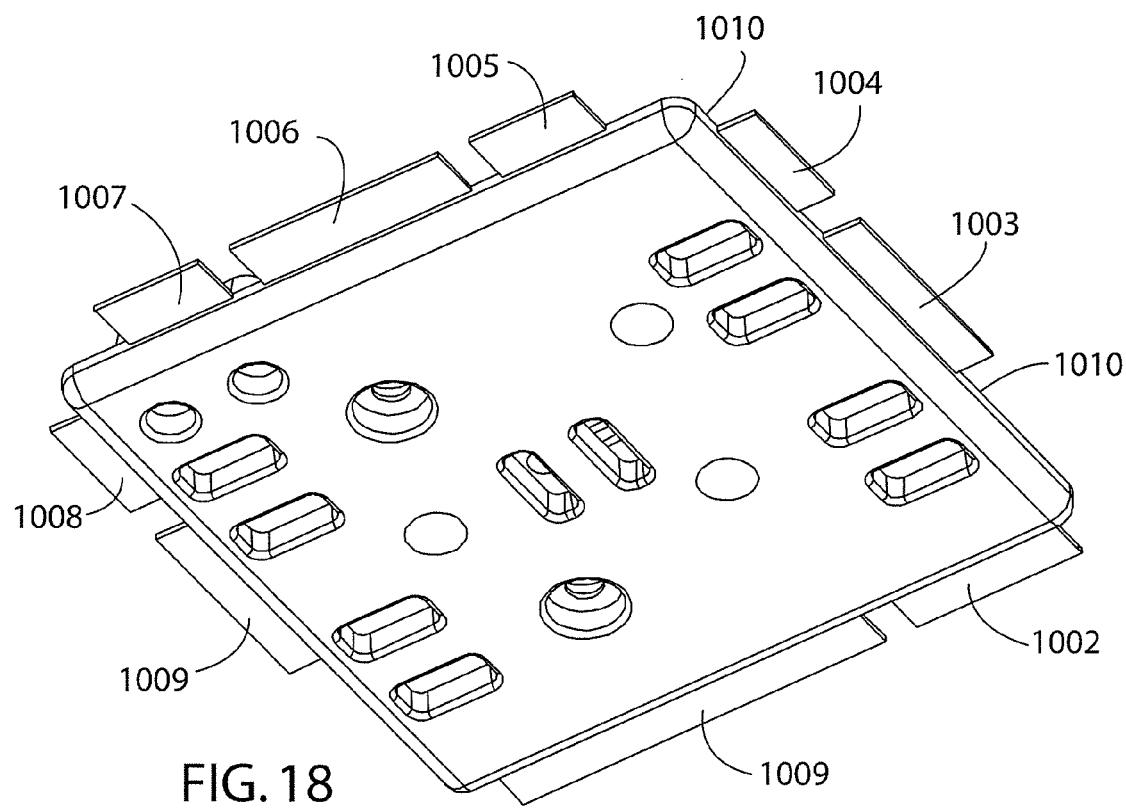
FIG. 18 is an isometric view of the completed part of FIG. 16 from a different angle.
Figure 20:
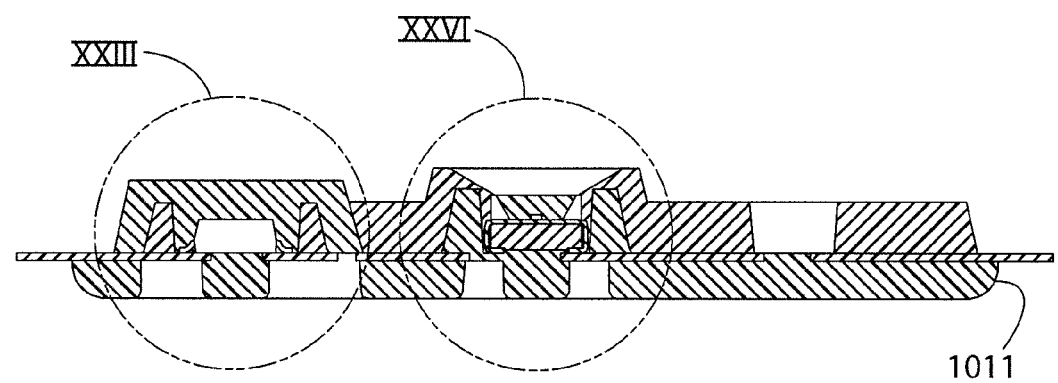
FIG. 20 is a cross-sectional view of the completed part of FIG. 19 taken along the line XX-XX.
Figure 19:
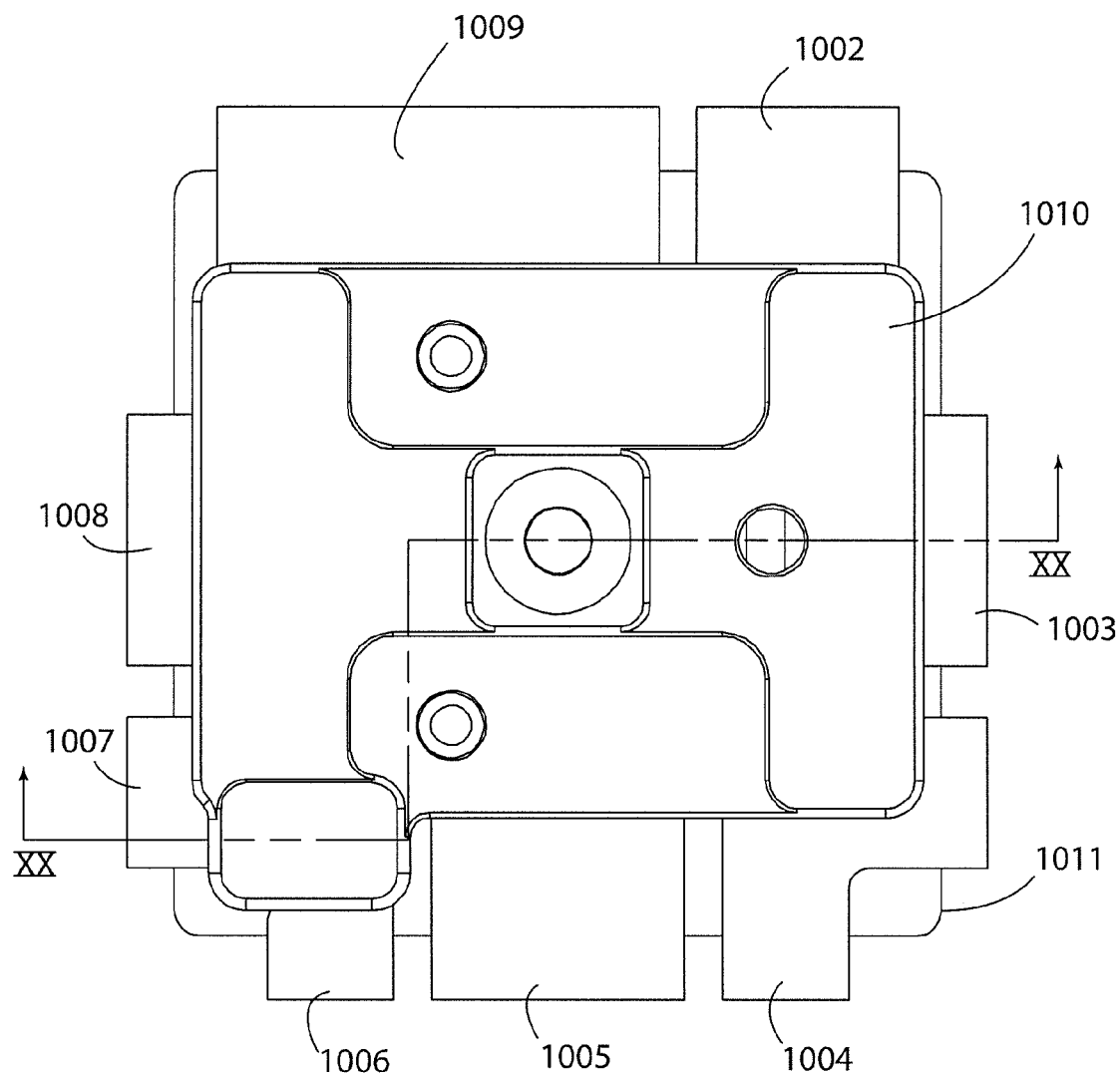
FIG. 19 is a plan view of the completed part of FIG. 16.

With reference to FIGS. 16-18, an electrical device 1001 according to one aspect of the present invention includes electrical conductors 1002-1009 (see also FIGS. 18 and 19) that are embedded in a non-conductive plastic material 1010. In the illustrated example, the electrical conductors 1002-1009 are made from sheet metal such as plated steel, brass, or the like, and include relatively large portions extending beyond the perimeter 1011 of the plastic material 1010. As described in more detail below, one or more electrical components such as an integrated circuit, LED, resistor, diode, capacitor, conductor, or virtually any other electrical component or components are at least partially encapsulated within the plastic material 1010 in electrical and thermal contact with the electrical conductors 1002-1009. The configuration of the electrical conductors 1002-1009 in the illustrated example provide for heat conduction from the electrical components embedded in the plastic material 1010. However, it will be understood that the electrical conductors utilized to provide electrical connections to the embedded circuit components may have virtually any size, shape, or configuration, and may include a relatively small exposed external surface to provide for electrical and/or thermal connections. Still further, rather than having exposed portions of the electrical conductors 1002-1009, the electrical conductors may be completely encapsulated in the plastic material 1010, and an electrical connector of a conventional, known configuration may be electrically connected to one or more of the electrical conductors 1002-1009 and embedded within the plastic material 1010, such that the conventional electrical plug or other known connector may be the sole external electrical connecting feature for the electrical conductors 1002-1009.

Figure 21:
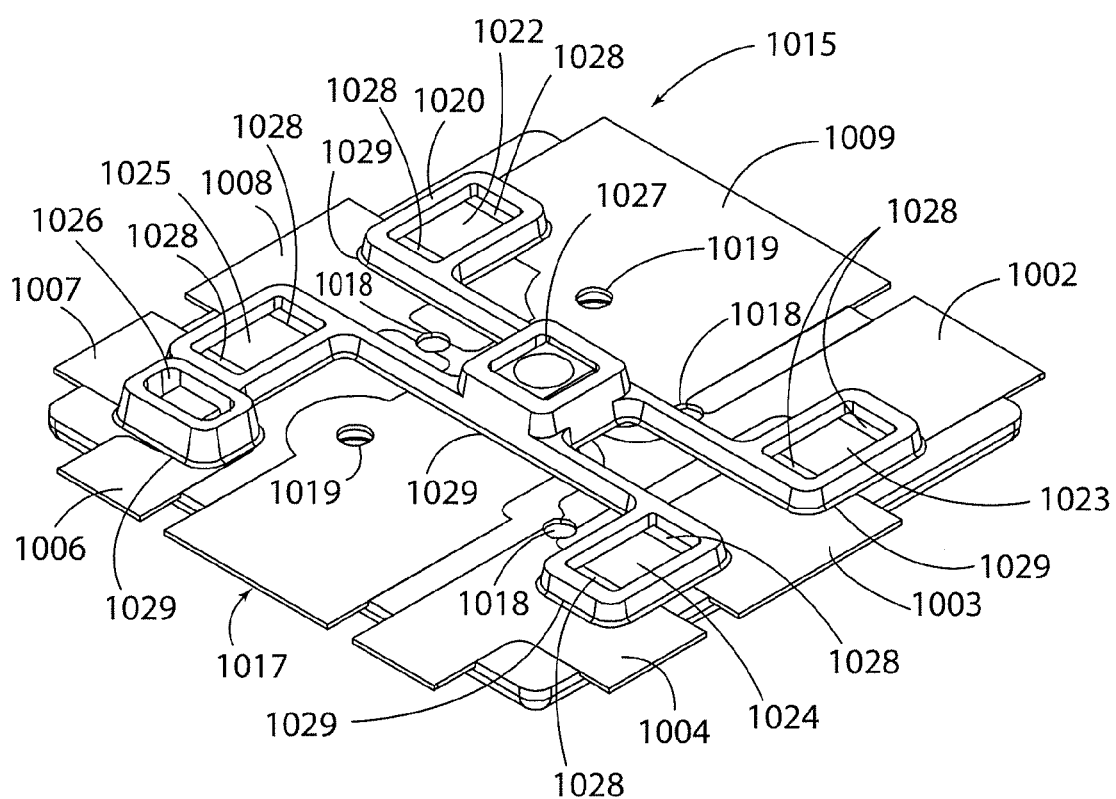
FIG. 21 is an isometric view of a "first shot part" showing pockets formed by a first injection molding step.
Figure 22:
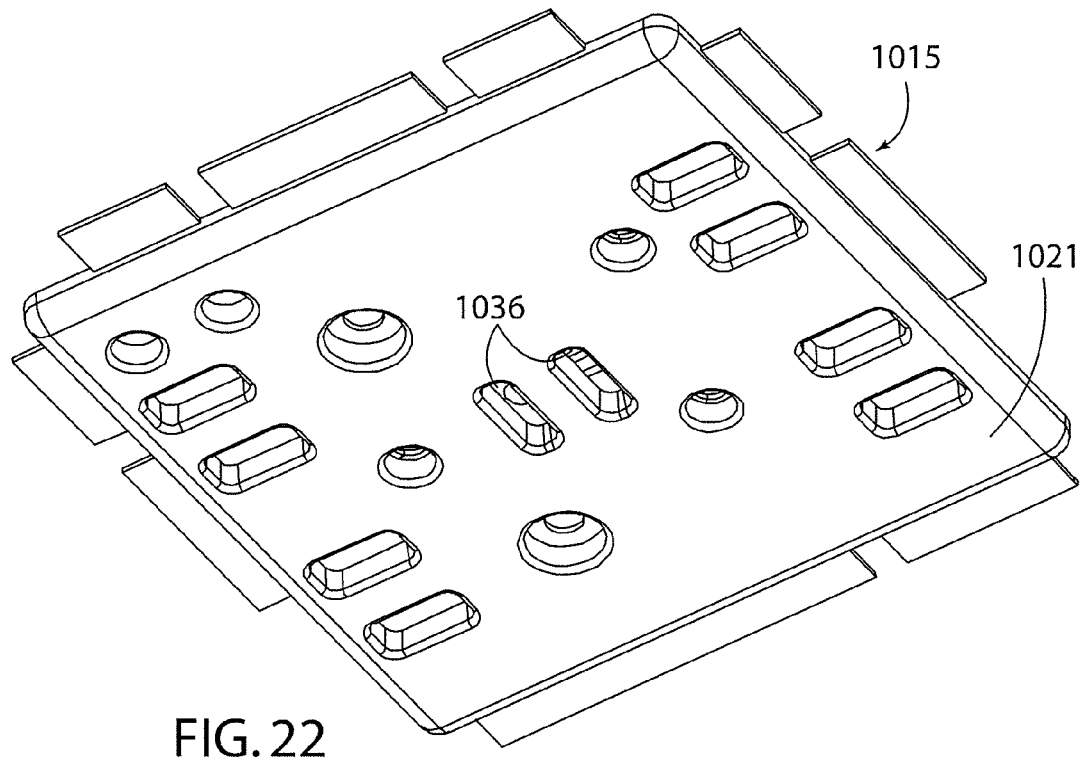
FIG. 22 is an isometric view of the first shot part of FIG. 21 from a different angle.
Figure 23:
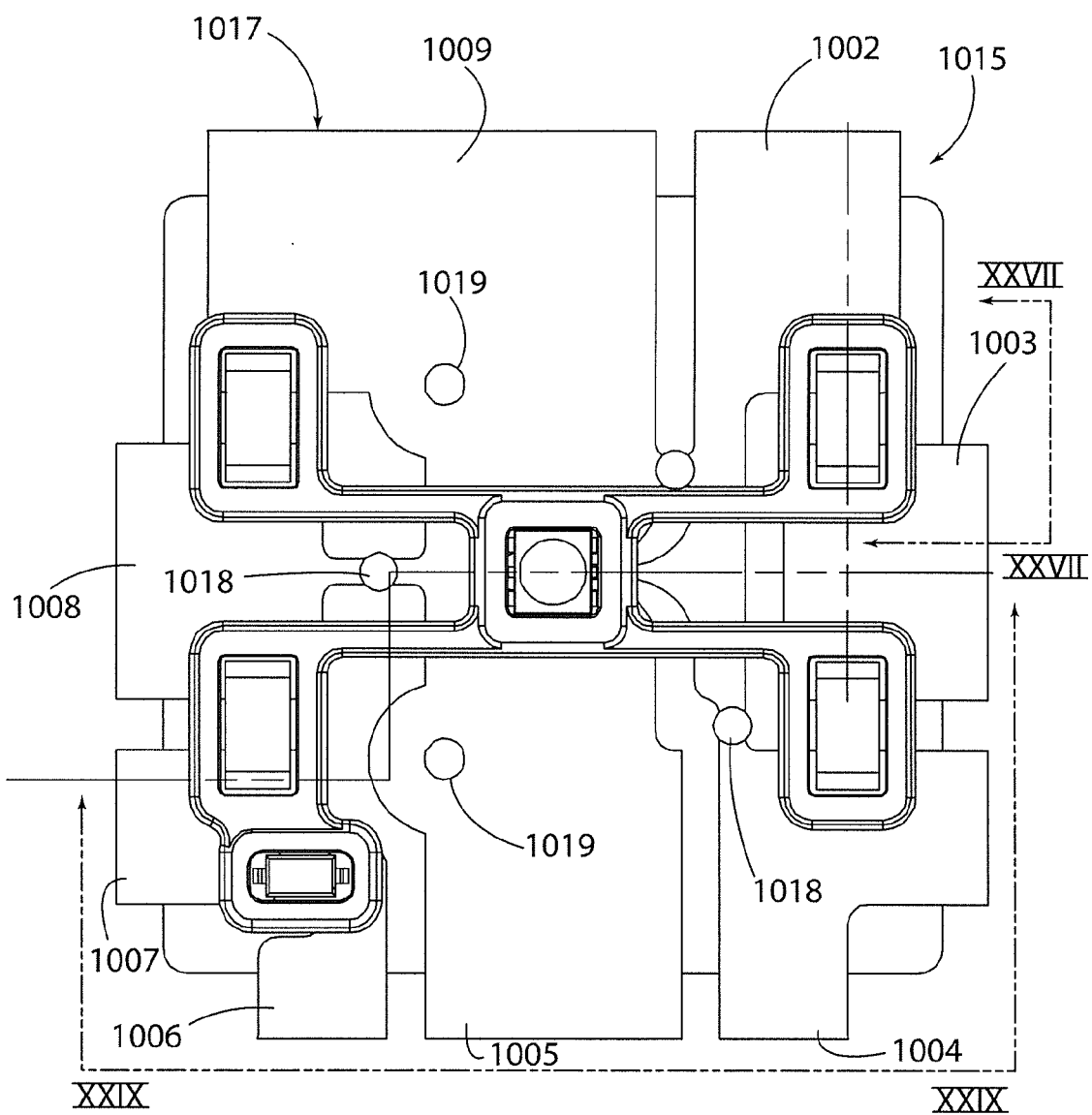
FIG. 23 is a plan view of the first shot part of FIG. 21.

With reference to FIGS. 21-23, during fabrication of the electrical device 1001 according to a first method, a "first shot part" 1015 may initially be formed. When utilizing this method, the first shot part 1015 is made by placing a web 1017 of electrically conductive material into a first mold (not shown). The web 1017 is formed from sheet metal or the like in a progressive die or the like. In the illustrated example, the web 1017 and electrical conductors 1002-1009 (made from the web 1017) have a substantially planar shape. However, it will be understood that the web 1017 and electrical conductors formed from the web 1017 may have virtually any shape as required for a given application. Furthermore, it will be understood that the electrical conductors may be made from materials other than sheet metal utilizing a range of forming processes as required for a particular application.

The web 1017 is initially formed as a one-piece part with a plurality of connecting portions 1018 that physically and electrically interconnect the electrical conductors 1002-1009. One or more locating holes 1019 are also formed in the web 1017 by the progressive die. The web 1017 may be interconnected with adjacent webs 1017 (not shown) by a plurality of metal web connecting parts (not shown) to thereby form an elongated strip of material having a plurality of individual web parts 1017. The web 1017 is positioned a first mold tool (not shown), and pins or the like (also not shown) are received in locating holes 1019 to position the web 1017 in a tool that cuts the connecting portions 1018 to thereby electrically and physically separate the electrical conductors 1002-1009 from one another. The web 1017 may also be cut apart from the adjacent web 1017 if desired for a particular application. Nevertheless, in a preferred method, the web 1017 remains interconnected to the web section 1017 immediately adjacent thereto.

After the web 1017 is positioned in a first mold tool, the mold parts are brought together, molten plastic material is injected to form raised walls or ridges 1020, and a lower plastic portion 1021 (FIG. 22). The walls or ridges 1020 form a plurality of pockets 1022-1027. Each of the pockets includes exposed conductive surfaces 1028 that are formed by the electrical conductors 1002-1009. It will be understood that the mold cavity (not shown) has substantially the same shape as the external surfaces of the raised walls/ridges 1020 and lower plastic 1021, and the mold includes surfaces that tightly abut the electrical conductors 1002-1009 around the base edges 1029 of the raised walls/ridges 1020 to thereby prevent flow of the plastic material beyond the configuration shown in FIGS. 21-27.

Figure 24:
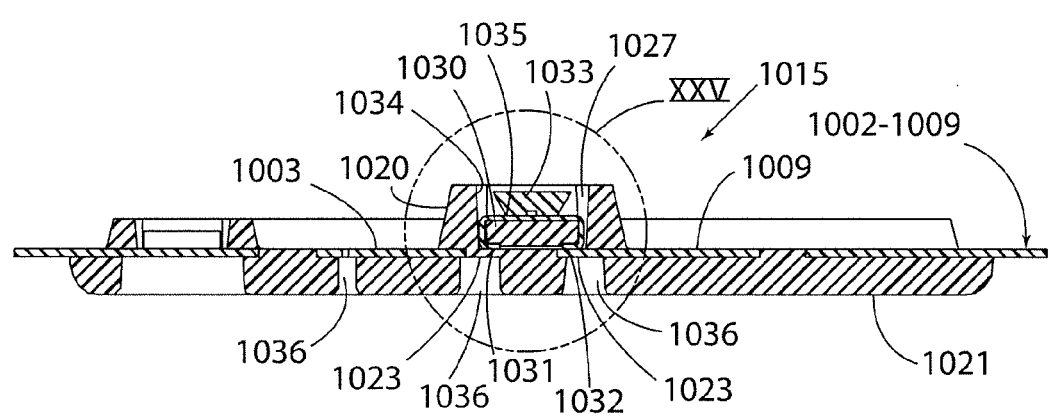
FIG. 24 is a cross-sectional view of the first shot part of FIG. 23 taken along the line XXIII-XXIII.
Figure 25:
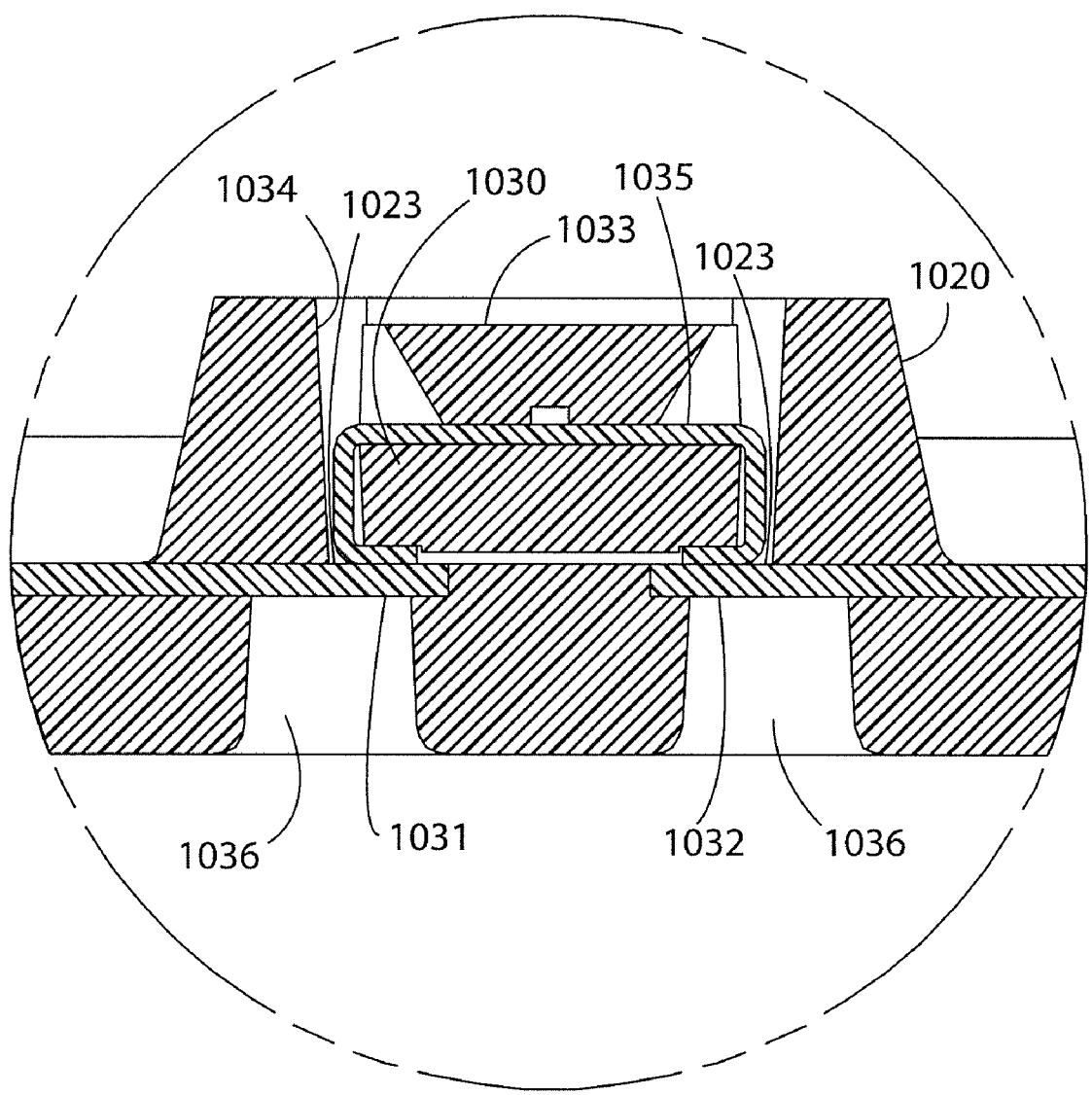
FIG. 25 is an enlarged view of a portion of the first shot part of FIG. 24.

After the first-shot part is formed, various electrical components are placed in the pockets 1022-1027 formed by the raised walls or ridges 1020. With further reference to FIGS. 24 and 25, an example of one such electrical components is an LED 1030 that is positioned in pocket 1027 with conductors 1031 and 1032 of LED 1030 in contact with exposed portions 1023 of 1003 and 1009. The exposed portions 1023 of the conductors within the pockets 1022-1027 is preferably coated with grease or the like to both hold the electrical component in place, and to ensure that the electrical component such as LED 1030 is in thermal contact with the electrical conductors. It will be appreciated that the LED 1030 is retained in position by the inner surfaces 1034 of walls or ridges 1020. Although the size of the pocket 1027 (or pockets 1022-1026) may be chosen such that the LED 1030 or other electrical component can move side-to-side to some degree, the inner surfaces 1034 of raised walls or ridges 1020 are preferably formed with a high enough degree of accuracy to ensure that the LED 1030 or other electrical component is positioned within tolerance for the final part, such that additional side-to-side positioning features/tooling, and the like is not required. Furthermore, the grease (not shown) or other material that helps retain the LED 1030 in contact with the conductive material ensures that the out of plane tolerance (i.e., up/down in FIG. 24) remains within tolerance. In the illustrated example, a plug or the like 1033 is positioned on upper surface 1035 of LED 1030. During the first shot molding process, one or more locating pins or other features (not shown) in the mold contact the web 1017 to support the web 1017 in the mold. These parts form one or more cavities 1036 in the first shot part 1015.

Figure 26:
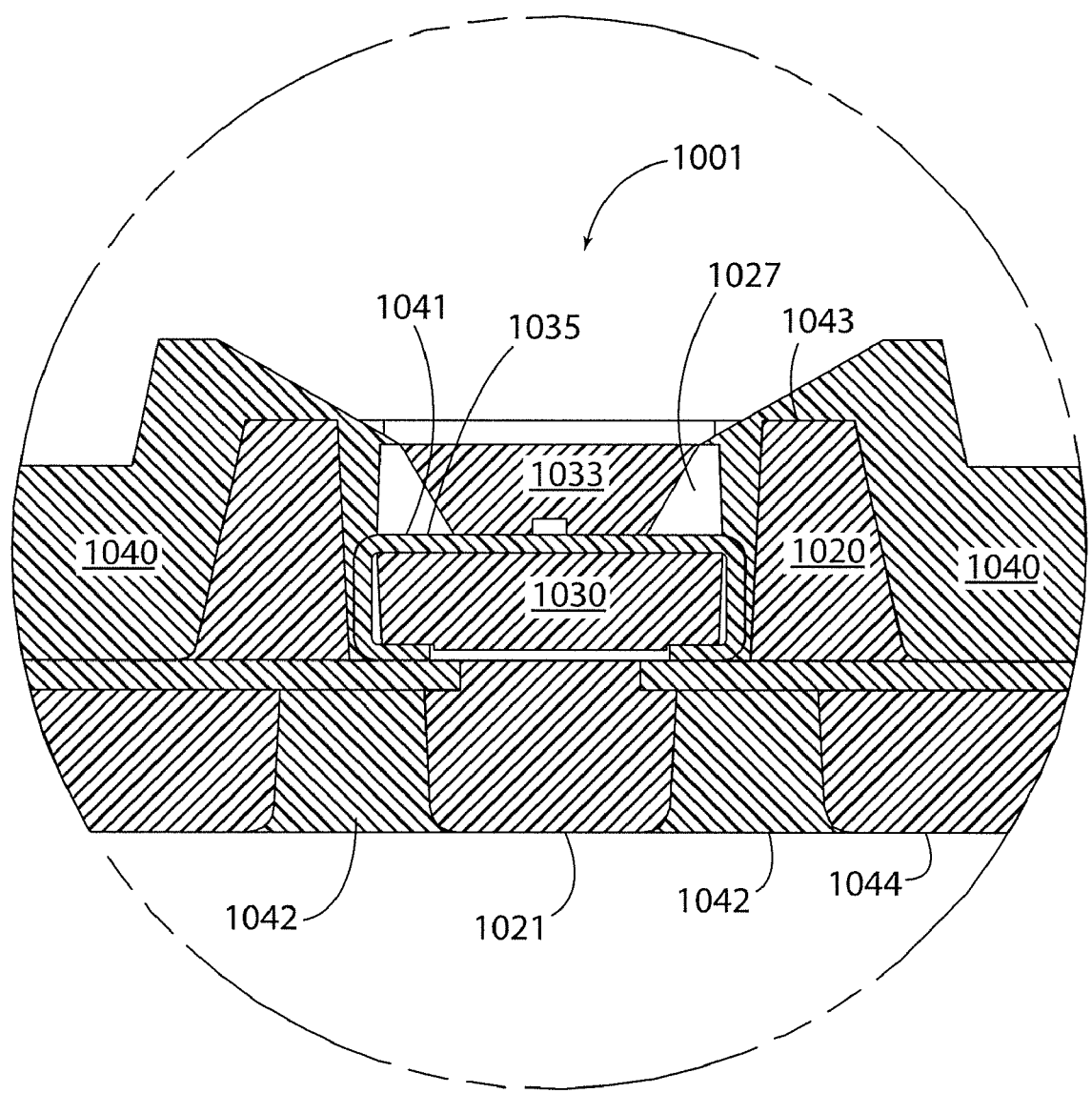
FIG. 26 is an enlarged view of the completed part corresponding to the first shot part of FIG. 25.

With further reference to FIG. 26, after the LED 1030 is positioned in cavity 1027 formed by walls 1020 by an electrical component placement device or machine (not shown), the first shot part 1015 is placed in a second mold tool (also not shown), and additional plastic material 1040 is injected to at least partially encapsulate the LED 1030 at contact areas 1041 between the LED 1030 and plastic material 1040. In this way, the LED 1030 is securely positioned in cavity 1027. The plug or tooling part 1033 may then be removed to expose the upper surface 1035 of LED 1030. The open area previously occupied by tooling part 1033 provides for unimpeded projection of light from LED 1030. Plastic material 1042 may be injected to fill cavities 1036 (FIG. 25) formed by the part-locating features of the first mold tool. Alternately, the cavities 1036 may simply be left unfilled if desired for a particular application. It will be appreciated that a clear boundary 1043 between plastic 1020 and plastic 1040 is shown in FIG. 26, the plastic 1020 and 1040 may melt together at least somewhat during the second shot molding operation, such that the plastic material 1020 and 1040 are fused together, forming an integral one-piece structure. If desired for a particular application, the first shot plastic material 1020 may be a different material than the second shot plastic material 1040. For example, the first shot material 1020 could be opaque to provide a finished surface 1044 having the desired appearance, and the second shot material 1040 could be transparent or light-transmitting translucent colored plastic to provide for light transmission through the plastic material 1040.

Figure 27:
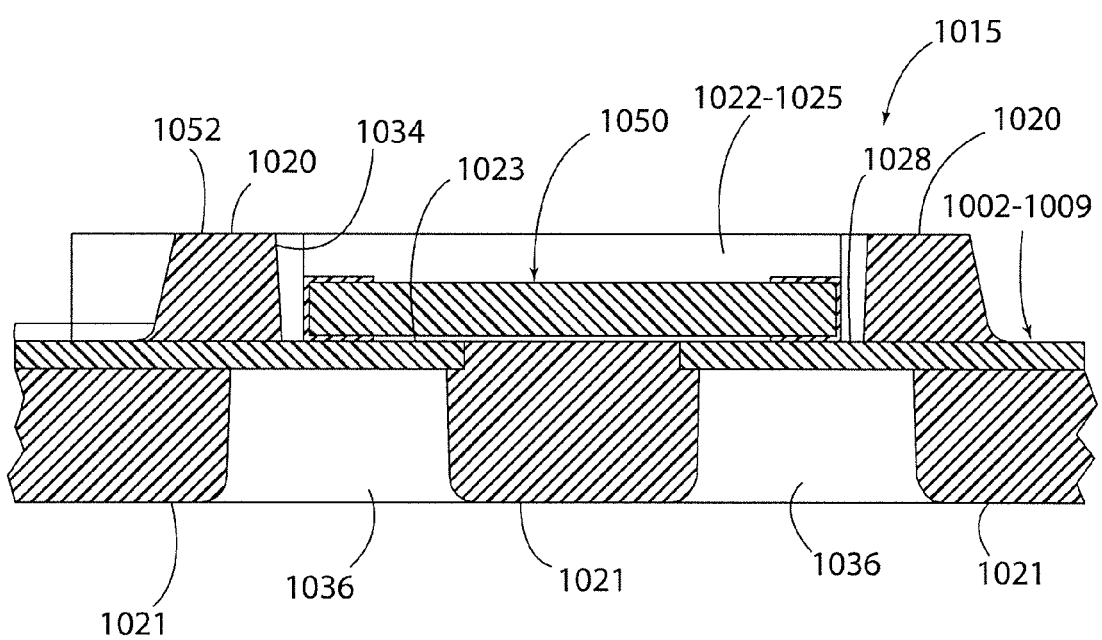
FIG. 27 is a cross-sectional view of the first shot part taken along the line XXVII-XXVII.
Figure 28:
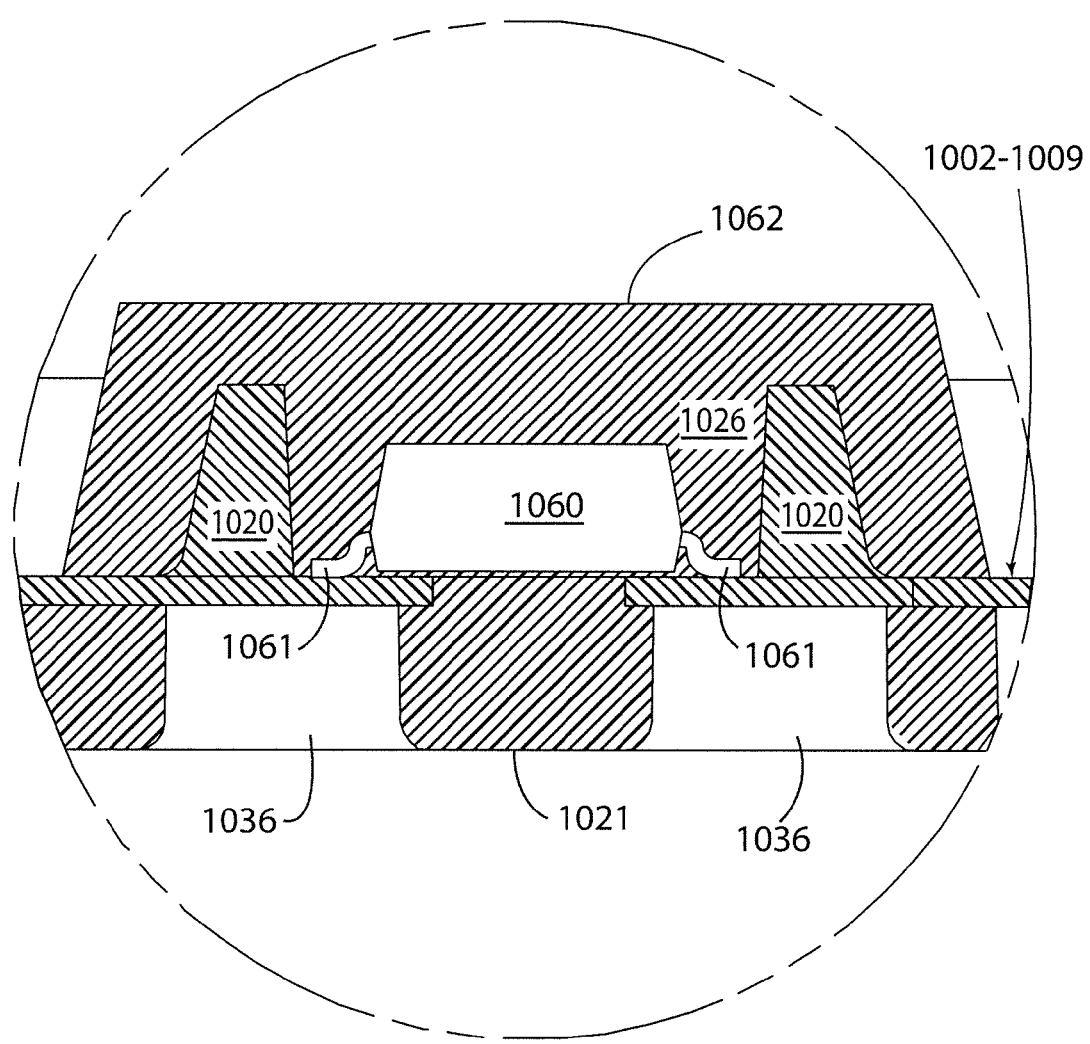
FIG. 28 is an enlarged view of a portion of the completed part of FIG. 20.

With further reference to FIG. 27, resistors 1050 are positioned in pockets 1022-1025 in electrical contact with selected ones of the electrical conductors 1002-1009. The resistors 1050 are retained in position within tolerance by the side walls 1034 of raised walls or ridges 1020, and a thin layer of grease or other material (not shown) is utilized to help retain the physical and electrical contact between the resistors 1050 and the electrical conductors 1002-1009. After resistor 1050 is positioned in a pocket as illustrated in FIG. 27, substantially the entire pocket 1022-1025 may be filled with plastic material 1051 (FIG. 16) to fully encapsulate the resistor 1050. Cavities 1036 may also be filled with plastic material during the second shot mold step. It will be appreciated that the plastic material 1051 may not only fill the cavities 1022-1025, but it may also fully encapsulate the ridges 1020, thereby covering at least a portion of outer surfaces 1052 of ridges 1020.

With further reference to FIG. 2B, a diode 1060 may be positioned in cavity 1026 with electrical contacts 1061 of diode 1060 in contact with selected ones of the electrical conductors 1002-1009. Cavity 1026 is then filled with plastic material 1062 during the second shot of the molding operation. The cavities 1036 may optionally be filled with plastic material during the second shot of the molding operation.

With reference back to FIG. 17, the process of forming electrical device 1001 according to one aspect of the present invention includes forming an electrical circuit from conductive material such as a sheet of metal. If a sheet of metal is utilized, the circuit may be formed utilizing a progressive die or other suitable tooling. However, it will be understood that the electrical circuit may be formed from a wide variety of conductive materials utilizing a wide variety of processes/techniques, and the illustrated example utilizing sheet metal formed in a progressive die is but one example of a suitable process/component. The electrical circuit is positioned in a first mold tool. As discussed above, locating holes 1019 are preferably formed in web 1017, and the locating holes 1019 are utilized to position the web 1017 in the first mold tool. As also described above, the first mold tool may include a plurality of locating surfaces that contact the web 1017 to position the web 1017 in the first molding tool, and thereby form cavities 1036 during the first shot mold process in the first mold tool. Molten plastic is then injected into the mold cavity to form the raised ridges or walls 1020, and the lower plastic 1021. It will be appreciated that the specific configuration of raised ridges 1020 and lower plastic 1021 is but one example of a virtually unlimited number of possible configurations that may be formed during the first shot molding step.

Figure 29:
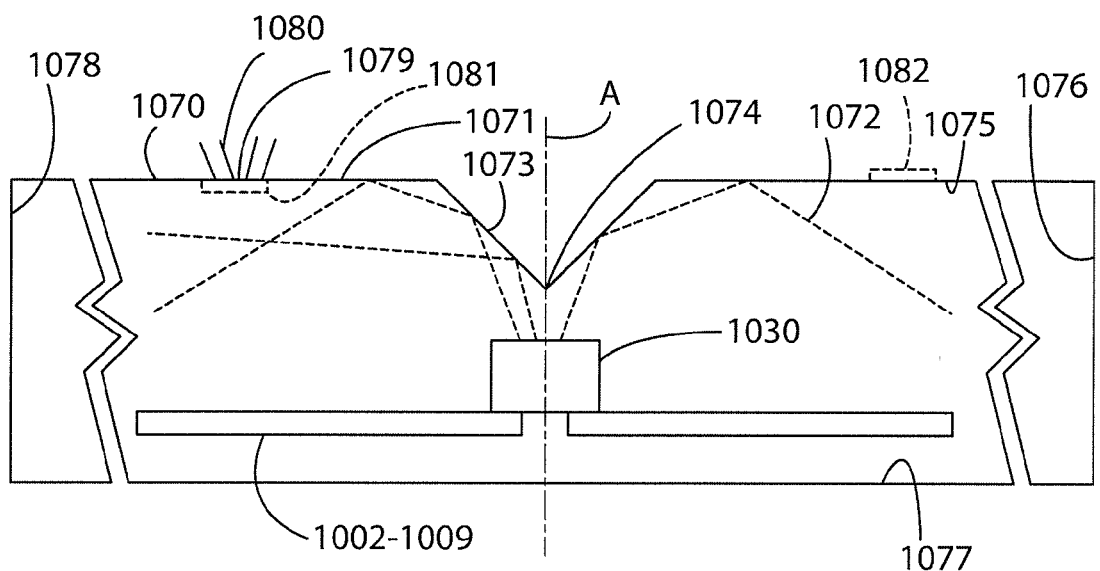
FIG. 29 is a fragmentary, partially cross-sectional view of a portion of a device according to another aspect of the present invention.

With further reference to FIG. 29, LED 1030 may be embedded in plastic material 1070 formed during the first or second shot molding step. Plastic material 1070 may be transparent or translucent to permit light rays 1072 to propagate within the material 1070. Outer surface 1071 of plastic 1070 defines a cone 1073 having a vertex (point) 1074 directly centered above the LED 1030. The light rays 1072 emitted by LED 1030 contact the conical surface 1073 and refract inwardly, and are therefore "trapped" within the plastic material 1070. It will be appreciated that the positioning of LED 1030 relative to the conical surface 1073, as well as the geometry of cone 1073 is chosen to ensure that the light rays 1072 are refracted internally. It will also be understood that although a conical surface 1073 is preferred, other surfaces could also be utilized to refract the light, or a substantial portion thereof, internally. For example, a pyramid-type surface or the like could be utilized to refract the light internally. Furthermore, a variety of curved or other irregular surfaces could also be utilized to internally refract at least a portion of the light emitted by LED 1030.

The inner surfaces 1075-1078 of plastic material 1070 are preferably smooth surfaces in most areas, such that the light rays 1072 are refracted internally, rather than diffusing as would be the case if the surfaces 1075-1078 were irregular or rough surfaces. The plastic material 1070 includes one or more rough surface areas 1079 having a frosted, or other light-diffusing property, such that the light rays 1072 are diffused and "escape" from within plastic material 1070 when the light rays 1072 hit the rough areas 1079. The rough areas 1079 may be positioned a significant distance from an axis A along which light from LED 1030 is initially directed. The rough surface areas 1079 "light up", and may form lettering, designs, or the like that are illuminated by LED 1030. Because the light rays 1072 are refracted internally in areas away from rough surface areas 1079, the light rays 1072 are not visible to a viewer except for the light rays 1072 that hit the rough surface areas 1079 and escape as diffused light 1080. Also, non-light transmitting material may be embedded in the plastic material 1070 in the vicinity of LED 1030 to form letters, designs, and other predefined patterns. For example, a thin layer of opaque material (not shown) may be embedded in the polymer material 1070 between the LED 1030 and the outer surface 1071 (e.g., between LED 1030 and vertex 1074 of cone 1073). Alternately, if polymer material 1070 does not form a cone 1073, but rather has an outer surface 1071 that is generally flat, a sheet of opaque material may be embedded between the LED 1030 and the surface 1071. The layer of opaque material may include one or more apertures therethrough in the shape of a letter, design, or the like. The layer of opaque material blocks the light rays from LED 1030 except for the aperture through the opaque material, such that a lighted pattern in the shape of the aperture is thereby formed.

In this way, the light rays emitted by LED 1030 can be utilized to form a variety of devices such as warning lights, decorative signs, or the like having specific messages, patterns, designs, or the like formed by rough surface areas 1079. It will be appreciated that a plurality of LEDs 1030 may be embedded within a single piece of plastic material 1070 if required for a particular application. Also, it will be appreciated that although some light rays 1079 or portions thereof do escape from plastic material 1070 through smooth surfaces 1075-1078, the smooth surfaces 1075-1078 refract a substantial portion of the light (e.g., approximately 80%), such that a high percentage of the light emitted by LED 1030 exits the plastic material 1070 at the rough surface areas 1079. Also, although the rough surface area 1079 is illustrated as being substantially flat, it will be readily appreciated that the rough surface areas 1079 may be formed in a cavity or the like 1081, or on a raised surface 1082.

Figure 30:
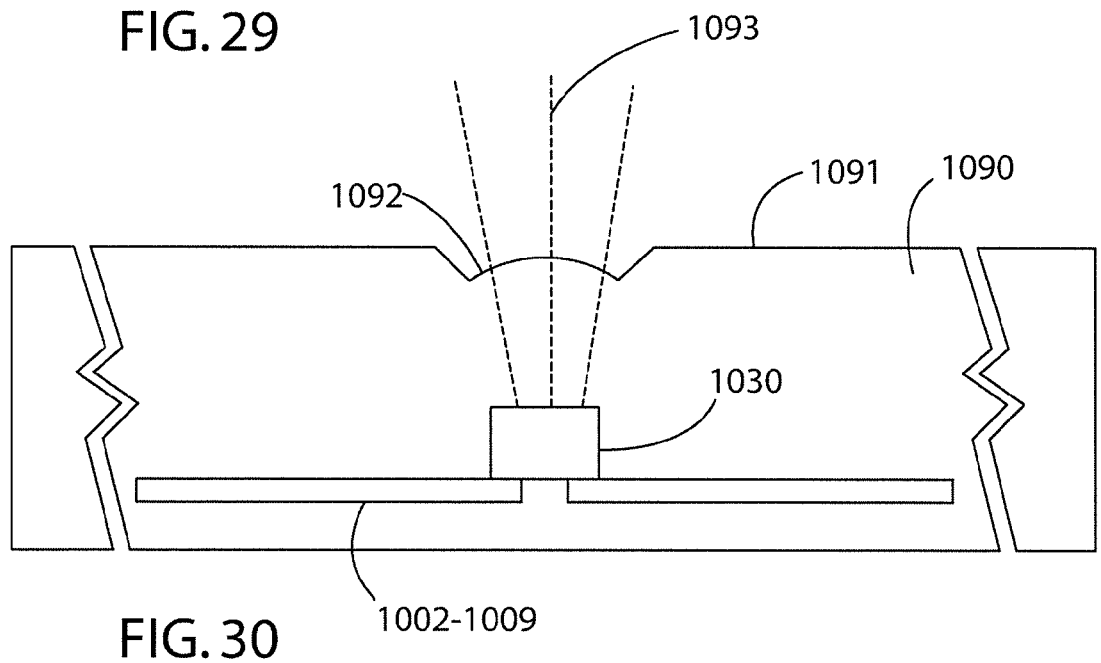
FIG. 30 is a fragmentary, partially cross-sectional view of a portion of a device according to another aspect of the present invention.

With further reference to FIG. 30, LED 1030 may also be encapsulated in plastic material formed during the second shot of the molding process described above. Surface 1091 of plastic material 1090 may define a lens 1092 directly in line with light rays 1093 emitted by LED 1030. In this way, the second shot of the molding process may be utilized to provide specific lens shapes that distribute the light 1093 produced by LED 1030 in a desired pattern. For example, the lens surface 1092 may distribute the light to provide for interior task lighting for a motor vehicle or the like. It will be understood that the plastic material 1090 may be transparent, translucent, or colored to provide the desired lighting effect.

The embedded LEDs of FIGS. 29 and 30 may be formed integrally with an electrical device 1001 during the second shot of the molded operation. Alternately, the LED 1030 may be molded into plastic 1070 to form a separate component that is not part of an electrical device 1001. It will be understood that the dimensions of the plastic material 1070 and/or 1090 may be chosen to form a component that is much larger than the LED 1030 itself. For example, the plastic material 1070 and/or 1090 could be quite large relative to the LED 1030, and the plastic material 1090 itself may be utilized to mount the device to a larger component such as a vehicle dashboard, interior task light, or the like. In this way, the plastic material 1070 and/or 1090 may form a structural part of the finished product and/or the outer surfaces 1071 and/or 1091 may form a finished surface that is a substantial portion of the assembly to which it is assembled.

After the first shot part 1015 is removed from the first mold tool, grease or other material may be deposited on exposed conductive surfaces 1028 within the pockets 1022-1027. A tool or the like (not shown) then positions the various electrical components in the pockets or cavities 1022-1027, with the electrical contacts of the components in electrical contact with selected ones of the electrical conductors 1002-1009. The first shot part 1015 is then positioned in the second mold tool, and additional plastic material is then injected around the electrical components to thereby at least partially encapsulate the electrical components and ensure that the electrical components remain in electrical and thermal contact with the electrical conductors 1002-1009.

Figure 31:
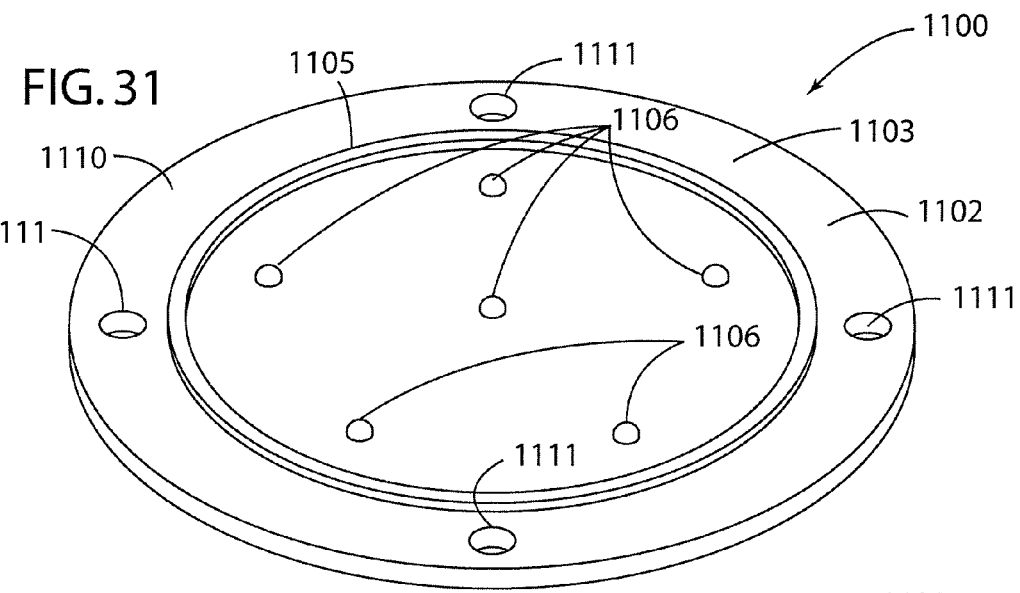
FIG. 31 is an isometric view of an electrical device according to another aspect of the present invention.
Figure 32:
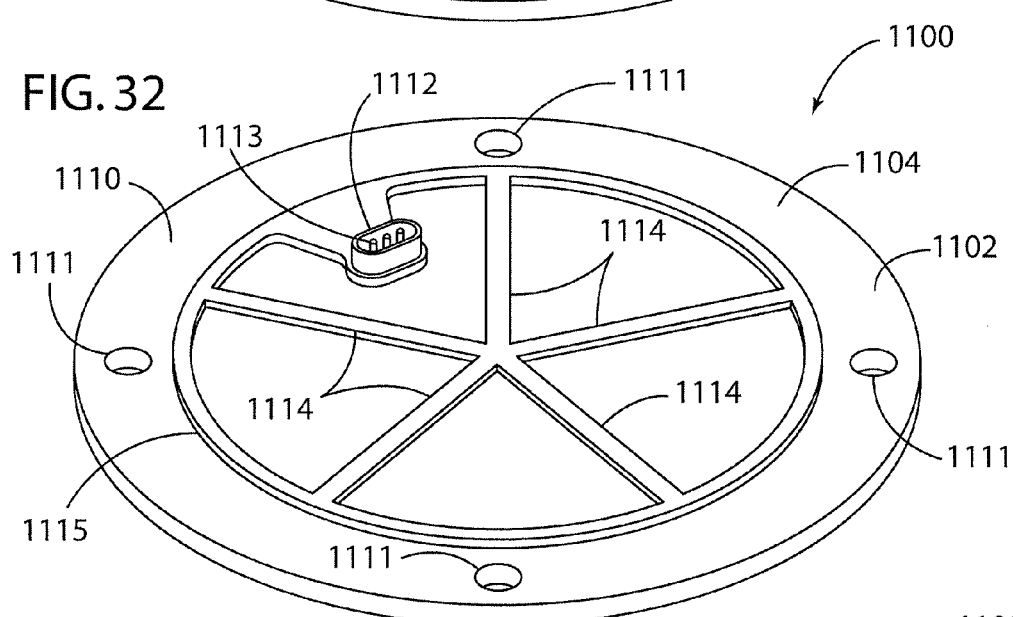
FIG. 32 is an isometric view of the device of FIG. 29 taken from a different point of view.
Figure 33:
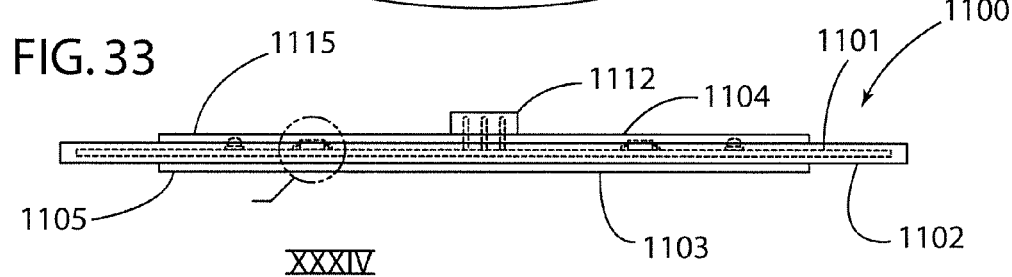
FIG. 33 is a side elevational view of the device of FIGS. 31 and 32.

With further reference to FIGS. 31-33, a device 1100 according to another aspect of the present invention comprises an LED light assembly having an electrically conductive circuit 1101 (see also FIG. 34) that is embedded in polymer material 1102. The electrically conductive circuit 1101 is preferably formed from sheet metal or the like utilizing a sheet metal stamping die to initially form a web as described in more detail above. In a preferred embodiment, the metal material utilized to form the circuit 1101 has a thickness of at least about 0.003 inches thick, and more preferably at least about 0.008 inches thick. According to other aspects of the present invention, the circuit 1101 may be thicker, and may be, for example, 0.010-0.020 inches thick, or thicker, depending upon the requirements for a particular application. In general, circuit 1101 may be formed from material 0.25 inches thick or more. In general, material thicknesses greater than around 0.020 inches may be utilized if greater heat transfer capability is required for a particular application. In general, the circuit 1101 comprises a material that is substantially thicker than the conductive material formed on conventional circuit boards.

The light assembly 1100 includes a first side 1103 (FIG. 31), and a second side 1104 (FIG. 32). In the illustrated example, the first side 1103 includes a first raised annular ridge 1105, and a plurality of raised portions 1106 forming lenses that control the distribution of light emitted from LEDs embedded within the polymer material 1102 immediately adjacent the lens portions 1106. Lens portions 1106 may be configured as illustrated in, for example, FIGS. 29 and 30, or the raised portions 1106 may have a shape as disclosed in co-pending U.S. Patent Publication No. 2008/0247173, entitled LENS SYSTEM FOR LED LIGHTS. In the illustrated example, the raised portions 1106 comprise small dome-like structures having a smooth surface that distributes light from LEDs embedded in the polymer material 1102 as described in detail below. The surfaces of the plastic material 1102 adjacent and between the raised portions 1106 may have a frosted or rough surface to provide for escape/distribution of light in substantially the same manner as described above in connection with FIG. 29. In this way, a relatively large portion of the surface of the polymer material 1102 may be illuminated by the LEDs positioned immediately below raised portions 1106. In the illustrated example, the polymer material 1102 extends outwardly to form a flange 1110 having a plurality of openings 1111 therethrough. In use, the openings 1111 receive threaded fasteners or the like to secure the light assembly 1100 to a mounting structure or the like. In the illustrated example, the light assembly 1100 comprises an exterior light assembly that is suitable for mounting to a motor vehicle or the like. The LED light assembly 1100 may comprise a taillight for a semi-trailer or the like. The polymer material 1102 forms a receptacle 1112 on the second side 1104. As described in more detail below, a plurality of prongs 1113 of the circuit material 1101 provide for connection to a 12 volt D.C. power source or the like of the motor vehicle. The polymer material 1102 may form one or more ridges 1114 that extend in a spoke-like manner and connect to a second annular ridge 1115 that protrudes outwardly from the second side 1104 of device 1100.

Figure 34:
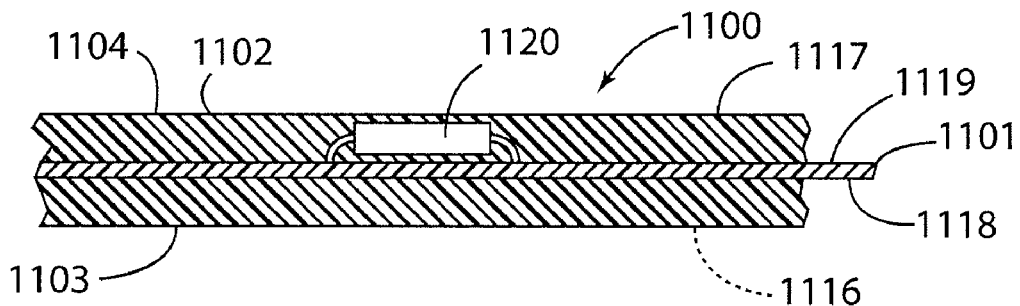
FIG. 34 is a partially fragmentary cross-sectional view of a portion of the device of FIG. 33.

With reference to FIG. 34, the electrical circuit material 1101 is substantially encapsulated by the polymer material 1102. Specifically, a first layer 1116 of polymer material 1102 covers a first side surface 1118 of circuit 1101, and a second layer 1117 of polymer material 1102 covers a second side 1119 of circuit 1101. One or more electrical components 1120 are electrically and mechanically connected to the conductive circuit material 1101, and the polymer material 1102 encapsulates the electrical component(s) 1120. The electrical component 1120 may comprise a resistor, a diode, a zener diode, a transistor, an integrated circuit, an inductor, a capacitor, a transient voltage suppressor ("TVS"), a metal oxide varister ("MOV"), or virtually any other electrical circuit component. One or more of the electrical components 1120 are connected to the circuit 1101 to control the current and/or voltage supplied to the LEDs of the device 1100.

Figure 35:
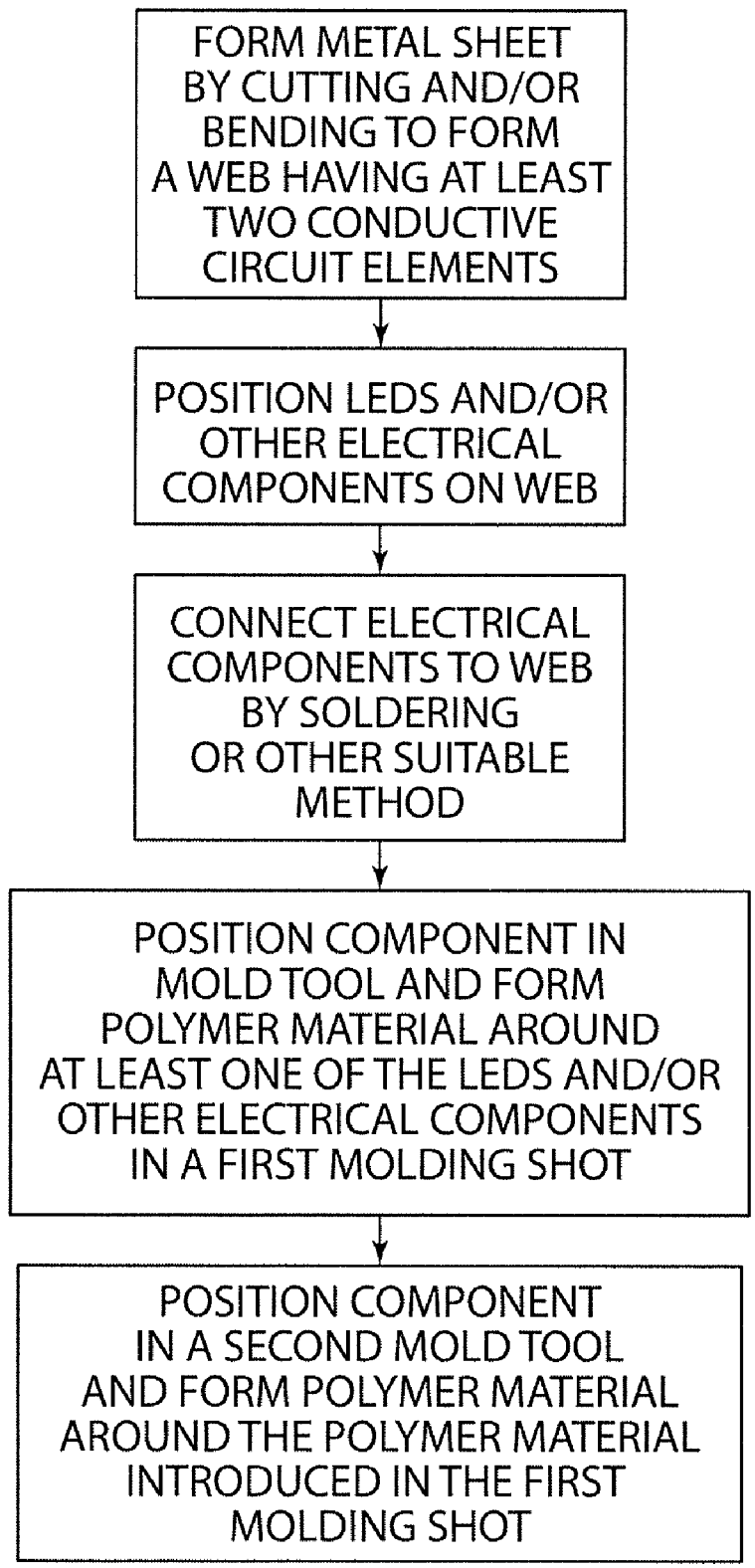
FIG. 35 is a diagram illustrating a method of making the device of FIG. 31.
Figure 37:
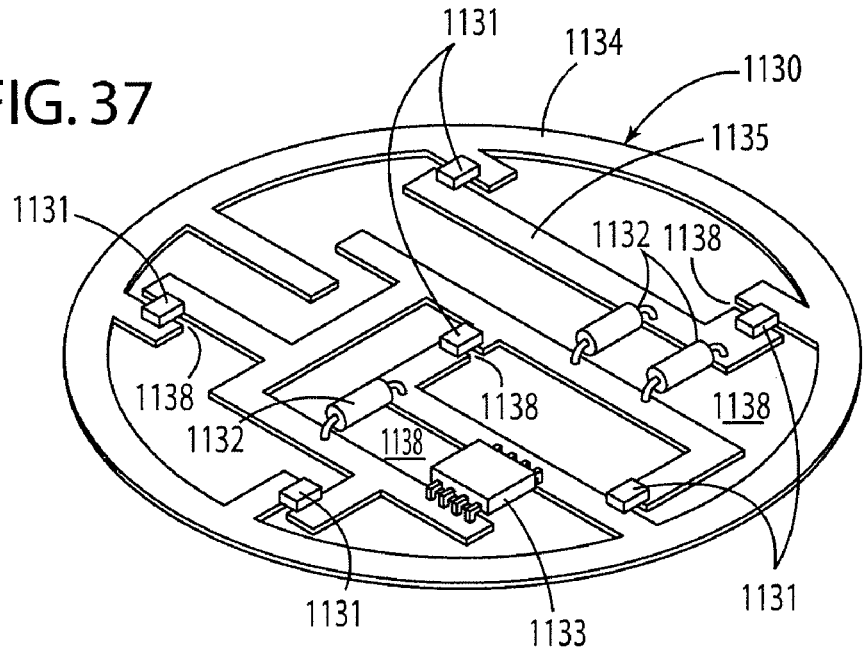
FIG. 37 is an isometric view of the circuit of FIG. 36 having electrical components attached thereto.
Figure 38:
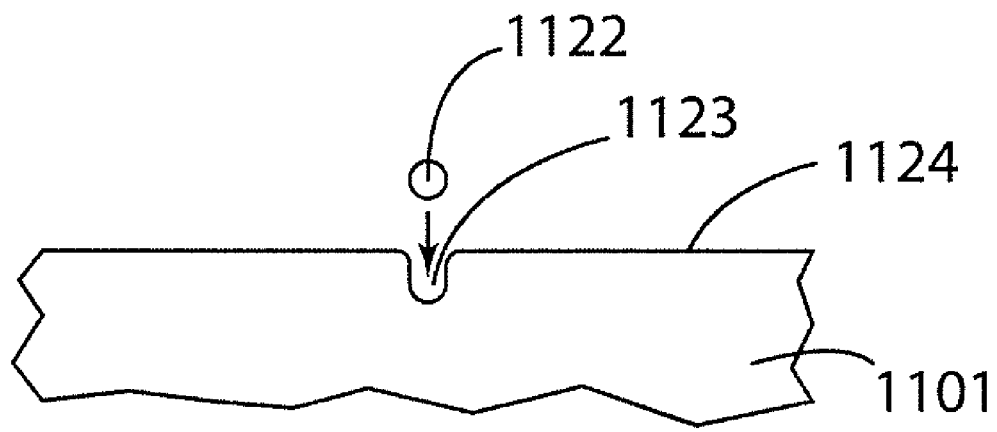
FIG. 38 is a fragmentary, partially schematic view showing one way to electrically and/or mechanically connect an electrical component to the circuit of FIG. 36.
Figure 39:
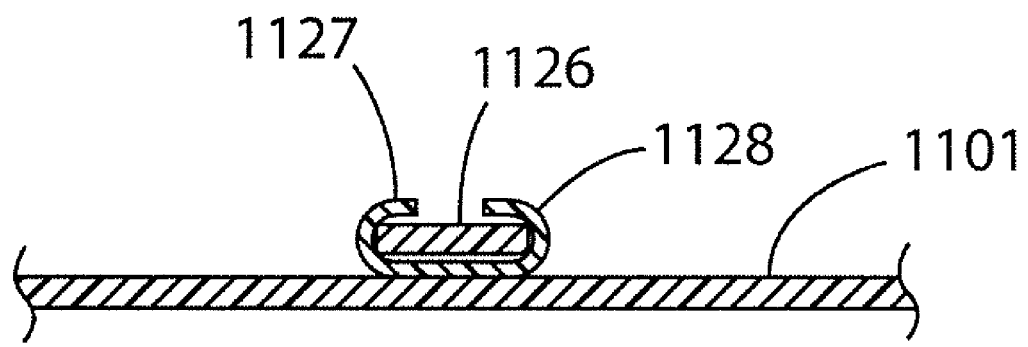
FIG. 39 is a partially schematic cross-sectional view showing another way to mechanically and/or electrically connect an electrical component to the circuit of FIG. 36.

With further reference to FIG. 35, during fabrication of device 1100, sheet metal is first formed by cutting and/or bending the sheet metal to form a web 1130 (FIG. 36) having at least two conductive circuit elements. As discussed in more detail above, the conductive circuit elements are preferably initially interconnected by small metal portions that are later cut or punched out to disconnect the conductive circuit elements from one another. After the web 1130 is formed, LEDs 1131 (FIG. 37) and/or other electrical components 1132, 1133 are positioned on the circuit elements of the web 1130, and the LEDs 1131 and/or other electrical components 1132, 1133 are then secured to the web 1130. The LEDs 1131 and/or other electrical components 1132, 1133 may be secured utilizing a soldering technique or other suitable method. If the device includes one or more printed circuit boards (PCBs) as shown in FIGS. 1-15, the electrical components may be secured to the PCBs rather than to the web as shown in FIG. 35. With further reference to FIG. 38, one alternative to soldering includes positioning a lead 1122 of an electrical component in a tapered notch 1123 formed in an edge 1124 of circuit material 1101. The lead 1122 may have a dimension that is the same as that of notch 1123, or slightly greater than tapered notch 1123, such that lead 1122 forms a tight interference fit in tapered notch 1123. Alternately, with reference to FIG. 39, a lead 1126 of an electrical component may be secured to circuit material 1101 by crimping tabs 1127 and 1128 around lead 1126. It will be understood that other suitable connecting techniques may also be utilized according to the present invention.

With reference back to FIG. 35, after the LEDs 1131 and/or other electrical components 1132, 1133 are secured to the web 1130, the resulting component is positioned in a mold tool, and thermoplastic polymer material is molded around the LEDs 1131 and/or other electrical components 1132, 1133 in a first molding shot. The method may, optionally, include positioning the component in a second mold tool, and additional polymer material may then be molded around the polymer material introduced in the first molding shot. Furthermore, third, fourth, fifth, or additional mold tools may also be utilized to mold additional polymer material around the polymer material formed during the first and second mold shots. It will be understood that a single mold shot process may be utilized according to other aspects of the present invention.

Figure 36:
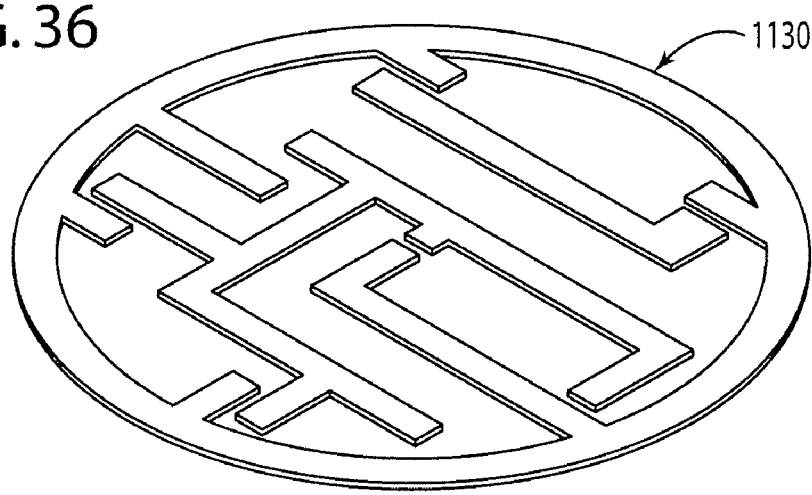
FIG. 36 is a perspective view of a conductive circuit element of the device of FIG. 31.

With further reference to FIG. 36, a conductive sheet of metal or other suitable material is first cut and/or formed to form an electrical web 1130. With further reference to FIG. 37, after the circuit web 1130 is formed, one or more LEDs 1131 may be secured to the web 1130 by soldering, or other suitable technique. In addition to the LEDs 1131, additional circuit components 1132 may be secured to the web 1130 by soldering or other suitable technique. The circuit components 1132 may comprise diodes, transistors, resistors, capacitors, or virtually any other electrical components utilized to form a circuit that supplies a desired current and/or voltage level to the LEDs 1131 when the device 1100 is connected to a 12 volt vehicle power supply. An integrated circuit 1133 may also be connected to the web 1130 utilizing soldering or other suitable technique.

Figure 40:
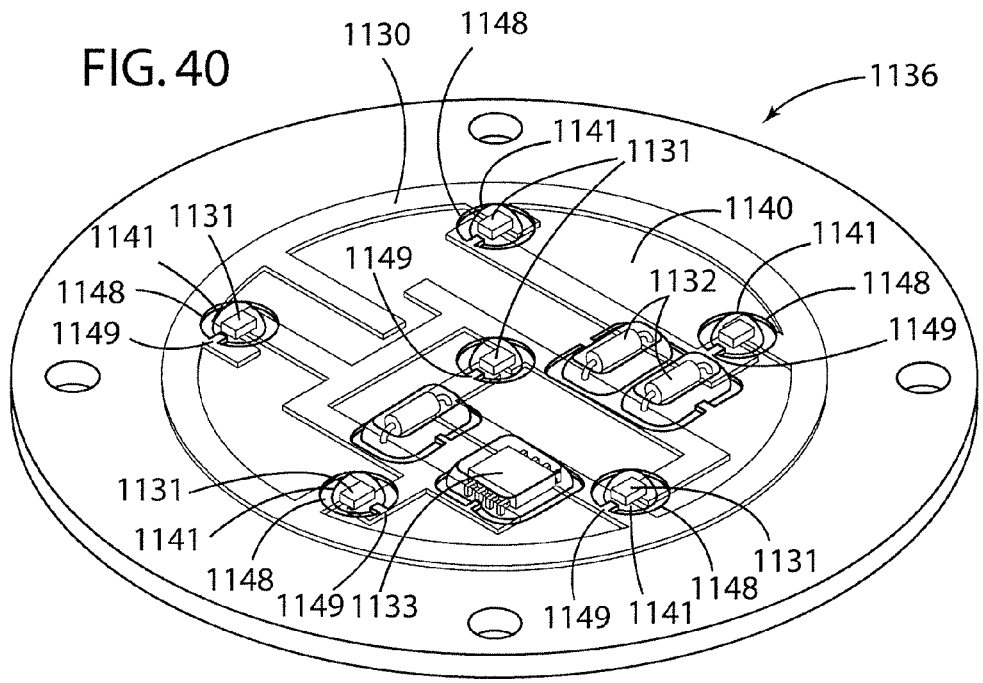
FIG. 40 is a perspective view of the device of FIG. 31 during an intermediate stage of the fabrication process showing the internal components encapsulated by translucent polymer material.
Figure 41:
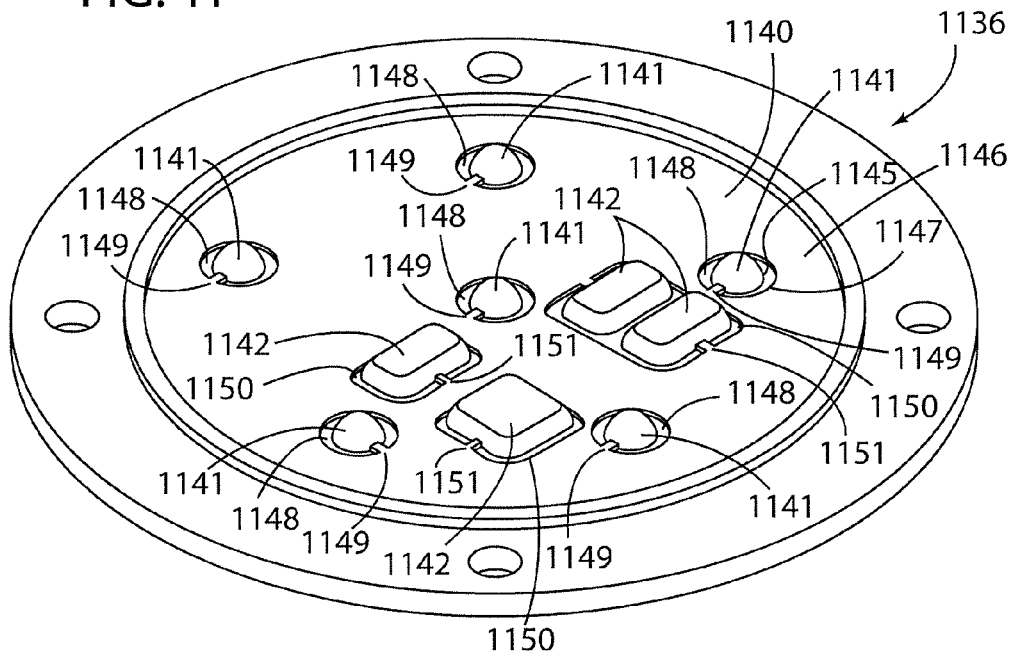
FIG. 41 is a perspective view of the device of FIG. 31 during an intermediate stage of the fabrication process showing the internal components encapsulated by polymer material.
Figure 42:
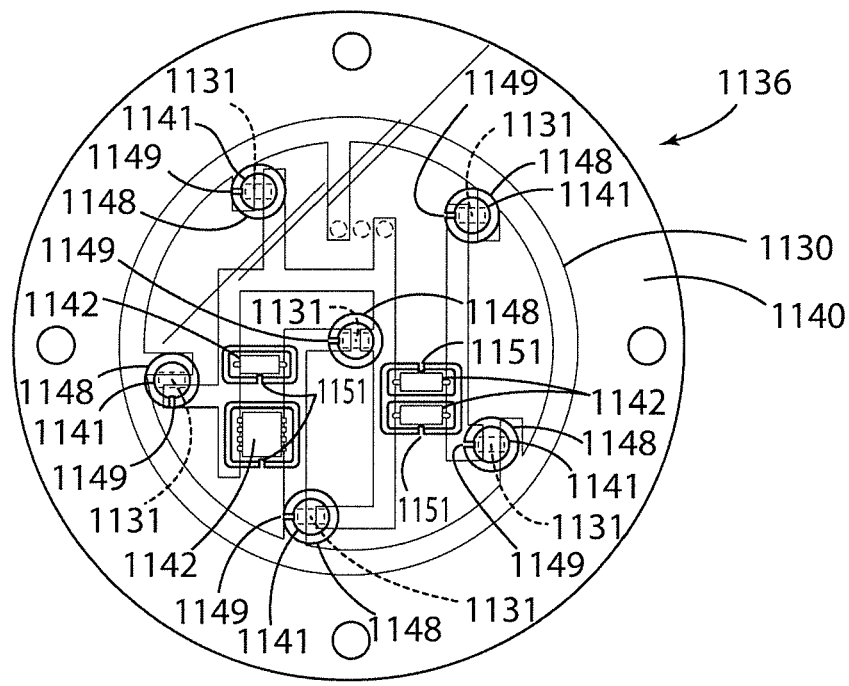
FIG. 42 is a plan view of the device of FIG. 31 during an intermediate stage of the fabrication process showing the internal components encapsulated by translucent polymer material.
Figure 43:
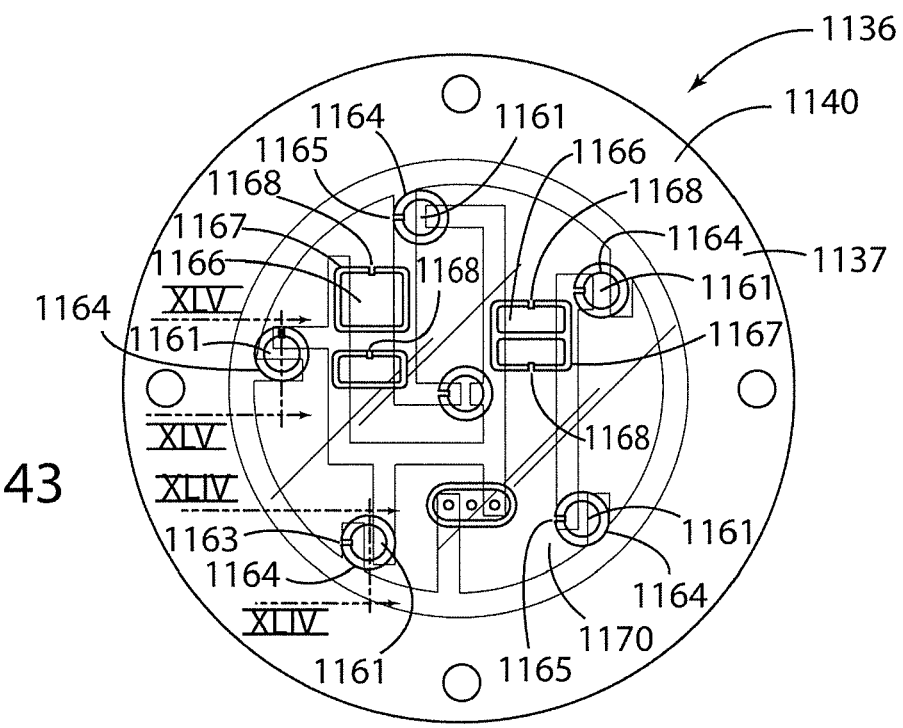
FIG. 43 is a plan view of the device of FIG. 31 during an intermediate stage of the fabrication process showing the internal components encapsulated by polymer material.

With further reference to FIG. 40, after the various electrical components are secured to the web 1130 as illustrated in FIG. 37, the web 1130 with the electrical components is then positioned in a first mold tool, and first thermoplastic polymer material 1140 is then molded over the web 1130 and around the diodes 1131 and other electrical components 1132 and/or integrated circuit 1133 to form an intermediate part 1136. In FIG. 40, the first polymer material 1140 is shown as being substantially clear, such that the LEDs 1131, electrical components 1132 and integrated circuit 1133 are visible through the second polymer material 1140. In FIG. 41, the first polymer material 1140 is illustrated as being substantially opaque to thereby illustrate the surface contour of the first polymer material 1140. Similarly, in FIG. 42 the polymer material 1140 is illustrated as being substantially clear, and in FIG. 43 the polymer material 1140 is shown as being opaque. In a preferred embodiment, the first polymer material 1140 comprises light-transmitting thermoplastic material that transmits light from the LEDs 1131. In particular, LEDs 1131 may comprise red LEDs, and the polymer material encapsulating the LEDs may also be red. Alternately, the LEDs 1131 may be amber, and the polymer material may also be amber. Still further, the LEDs 1131 may comprise white LEDs, and the polymer material may be substantially clear. Virtually any color LEDs and polymer material may be utilized according to the requirements of a particular application. Alternately, the LEDs of device 1100 may be of different colors, such that device 1100 produces light of different colors.

With reference to FIG. 41, the cavity of the first mold tool is configured to form protective capsules 1141 of the polymer material 1140 over the LEDs 1131. Similarly, protective capsules 1142 of polymer material 1140 are also formed over the electrical components 1132 and integrated circuit 1133. In the illustrated example, the protective capsules 1141 are dome-like in shape, and include a generally circular peripheral edge 1145 having a maximum diameter of about 0.375 inches. A layer 1146 of polymer material 1140 is also formed over the web 1130. The layer 1146 includes a generally circular edge 1147 that is spaced apart from circular peripheral edge 1145 of protective capsules 1141 to thereby form a C-shaped groove 1148 that extends around the protective capsules 1141. A small bridge portion 1149 of the polymer material 1140 extends between the layer of polymer material 1146 to the protective capsule 1141. As described in more detail below, the small bridge of material 1149 is formed by a small passageway in the first mold tool that provides for flow of polymer material from the cavity forming layer 1146 to the small cavity portion that forms the protective capsules 1141.

Protective capsules 1142 are similar to protective capsules 1141, except that protective capsules 1142 have a shape that generally corresponds to the circuit components 1132 and/or integrated circuit 1133. Each of the protective capsules 1142 is surrounded by a groove 1150 that is substantially similar to grooves 1148, and each protective capsule 1142 is connected to layer 1146 of polymer material by a small bridge 1151 that may be substantially similar to bridge 1149 interconnecting protective capsules 1141 with polymer material 1146.

Figure 44:
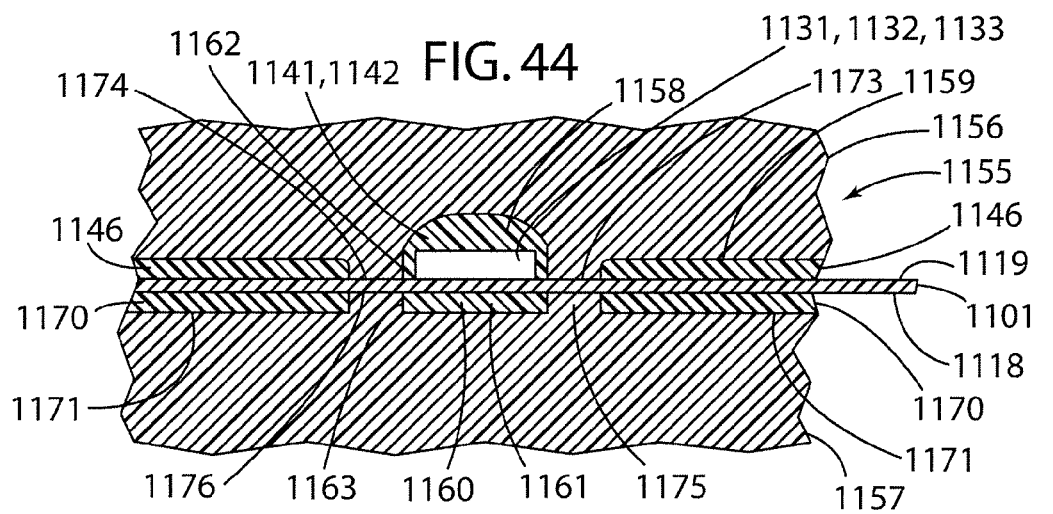
FIG. 44 is a cross-sectional view taken along the line XLIV-XLIV when the component of FIG. 43 is in a first mold tool.

With reference to FIG. 44, a first mold tool 1155 utilized to fabricate the intermediate part 1136 of FIGS. 40-43 includes a first mold part 1156 and a second mold part 1157. Web 1130 may include a plurality of locating holes (not shown) or the like, and first mold tool 1155 may include a plurality of pins that engage the openings to thereby position the circuit 1101 in first mold tool 1155. The first mold part 1156 includes one or more first cavities 1158 that form protective capsules 1141 and/or 1142 around LEDs 1131 and/or electrical components 1132 and 1133. The first mold part 1156 also includes a second cavity portion 1159 that is utilized to form a layer 1146 of polymer material on surface 1119 of the web or circuit 1101. Second mold part 1157 includes a first cavity portion 1160 that forms a small layer 1161 of polymer material on surface 1118 of circuit 1101. In general, the small layer 1161 may have a peripheral edge 1163 that has substantially the same shape and size in plan view as peripheral edge 1162 of protective capsule 1141. With reference back to FIG. 43, the layer 1161 of polymer material is formed on a bottom side 1137 of the intermediate part 1136, and a small bridge of plastic 1165 connects the layer 1161 with the layer 1170 extending over lower side 1137 of intermediate part 1136. As shown in FIG. 44, layer 1170 is formed by a second cavity portion 1171 of second mold tool part 1156.

Referring again to FIG. 44, first mold part 1156 includes a ridge 1173 that extends around first cavity portion 1158. The ridge 1173 includes a contact surface 1174 that abuts or contacts surface 1119 of circuit 1101. In the illustrated example, contact surface 1174 is substantially flat, and it fits closely against surface 1119 of circuit element 1101 to thereby form grooves 1148 (see also FIG. 41) that extend around protective capsules 1141. Similarly, second mold part 1157 includes a ridge 1175 extending around first cavity portion 1160. A contact surface 1176 formed by ridge 1175 fits tightly against surface 1118 of circuit element 1101 to thereby form grooves 1164 (see also FIG. 43) extending around the small layer 1161 of polymer material on lower side 1137 of intermediate part 1136. The first mold part 1156 and second mold part 1157 may include a plurality of cavities surrounded by ridges/contact surfaces as required to form protective capsules 1141 and 1142 over each of the electrical components mounted to the circuit 1101.

Figure 45:
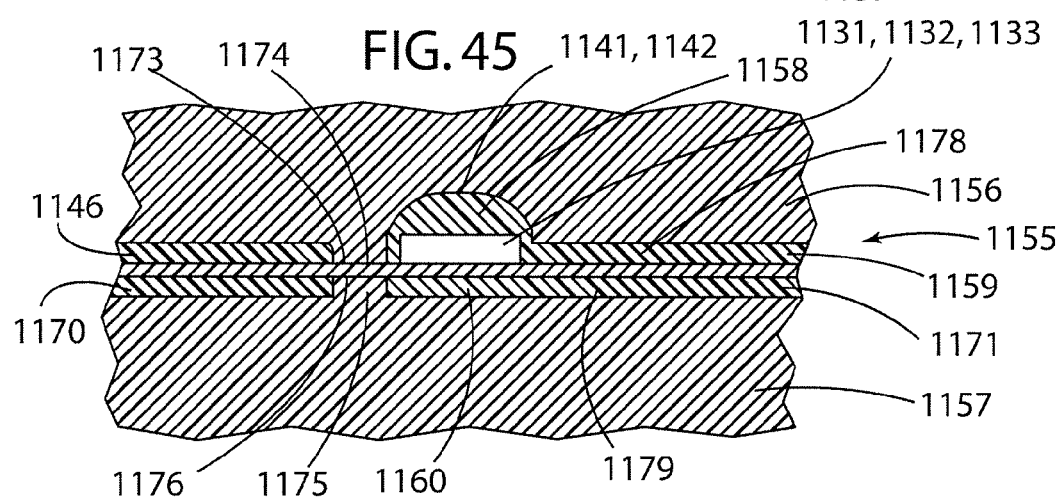
FIG. 45 is a cross-sectional view taken along the line XLV-XLV when the component of FIG. 43 is in a first mold tool.

With further reference to FIG. 45, first mold part 1156 includes an elongated passageway 1178 that interconnects first cavity portion 1158 with second cavity portion 1159. When thermoplastic polymer material is injected into the second cavity portion 1159, the polymer material flows through the elongated passageway 1178 and into the first cavity portion 1158 to thereby form a protective capsule 1141 or 1142. In general, the elongated passageway 1178 has a relatively small cross-sectional area such that the flow of molten polymer material from second cavity portion 1159 to the first cavity portion 1158 is substantially restricted. The polymer material in elongated passageway 1178 forms the polymer bridges 1149 (FIGS. 40-42) that interconnect the capsules 1141 with the polymer material 1146. Although the precise size and configuration of the elongated passageway 1178 may vary depending upon the needs of a particular application, in the illustrated example, the passageway 1178 has a width and a height of about 0.060 inches, and has a cross-sectional shape that is approximately semi-circular. The area of a half circle is equal to $\pi r^2/2$, such that the cross-sectional area of elongated passageway 1178 is approximately 0.0056 square inches. It will be understood that the length and cross-sectional area of elongated passageway 1178 may vary depending upon the electrical component being encapsulated by protective capsules 1141 and 1142, the type of polymer material used, and other such factors.

The passageway 1178 restricts the flow of the molten polymer material over the LEDs 1131 and other circuit components 1132, 1133. Because the first cavity portion 1158 is substantially sealed by ridge 1173 and contact surface 1174, molten polymer material flowing into first cavity portion 1158 from elongated passageway 1178 cannot flow freely over LED 1131 or circuit components 1132, 1133. In this way, the amount of heat and pressure transferred into the LEDs 1131 and/or components 1132, 1133 by the molten polymer material is limited. Furthermore, because the flow of polymer material in first cavity portion 1158 is substantially restricted, the forces imposed on LED 1131 and circuit components 1132 and 1133 due to flow of the molten polymer material is substantially reduced or controlled. In this way, the use of first cavity portion 1158 with a small elongated feeder passageway 1178 prevents damage to LEDs 1131 and circuit components 1132, 1133 and/or dislodgement of these components that could otherwise occur if a single large mold cavity were utilized. Furthermore, because the protective capsules 1141 and 1142 are largely disconnected from the other polymer material forming layer 1146 covering circuit 1101 when intermediate part 1136 is formed, the LEDs 1131 and components 1132 and 1133 do not experience forces that might otherwise be generated as the polymer material cools and hardens.

With reference back to FIG. 37, LEDs 1131 and electrical components 1132, 1133 are connected to a first conductor 1134 and a second conductor 1135 of web 1131 to provide positive and negative power to the components. In general, gaps 1138 are formed between the first and second conductors 1134, 1135, and the LEDs 1131 and electrical components 1132, 1133 span the gaps 1138. With reference back to FIG. 44, the contact surface 1174 of ridge 1173 of first mold part 1156 contacts the upper surface 1119 of circuit 1101. However, the contact surface 1174 also spans the gaps 1138 directly adjacent the LED 1131 or other circuit components 1132 and 1133. Thus, the gaps 1138 fill with molten polymer material that flows into the gaps 1138 from second cavity portion 1159, and/or first cavity portion 1158. Alternately, some polymer material may flow from second cavity portion 1159 through gap 1138 into first cavity portion 1158. Thus, although the elongated passageway 1178 generally provides the primary source of polymer flow from second cavity portion 1159 into first cavity portion 1158, some polymer material may flow through gaps 1138 as well. The gaps 1138 may be quite small in the vicinity of the LEDs 1131 and/or other circuit components 1132 and 1133 to restrict the flow of polymer through gaps 1138. In the illustrated example, the gaps 1138 have a width of about 0.015-0.030 inches. Thus, if the circuit 1101 is 0.020 inches thick, and gap 1138 is also 0.020 inches, the cross-sectional area of gap 1138 is 0.0004 square inches, much smaller than the cross-sectional area of a typical passageway 1178 noted above.

Referring again to FIG. 45, an elongated passageway 1179 in second mold part 1157 extends from first cavity portion 1160 of second mold part 1157 to second cavity portion 1171 to provide for flow of molten polymer material from second cavity portion 1171 to first cavity 1160. The elongated passageway 1179 in second mold part 1157 forms the bridges 1165 and 1168 of polymer material interconnecting the polymer layer 1170 with the polymer material 1161 on surface 1118 of conductor 1101. The passageway 1179 may have substantially the same size and shape as passageway 1178, and it similarly restricts the flow of molten polymer material between the first cavity portion 1160 of second mold part 1157 and the second cavity portion 1171 of second mold part 1157.

Figure 46:
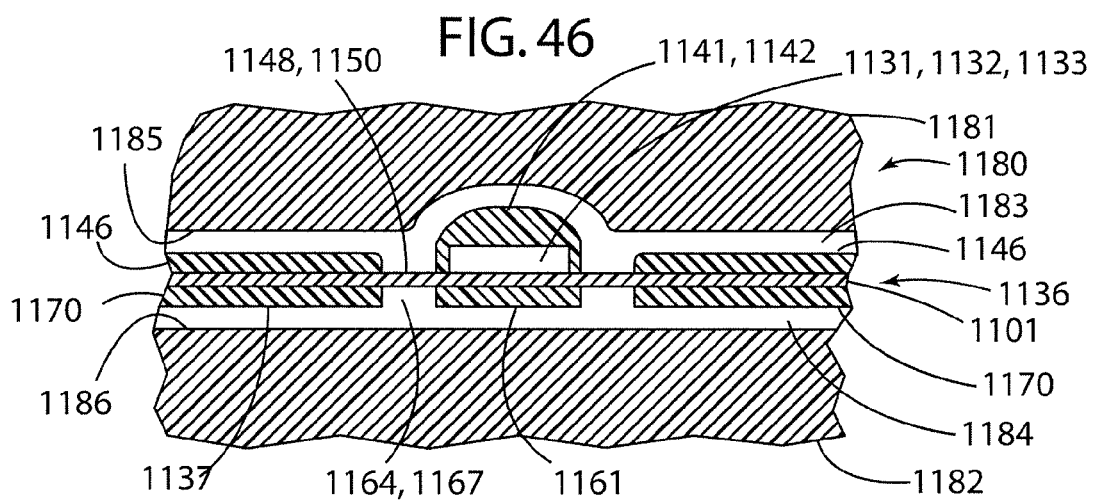
FIG. 46 is a cross-sectional view of the component of FIG. 43 positioned in a second mold tool immediately prior to injection of additional polymer material around the device.

After the intermediate part 1136 with protective capsules 1141 and 1142 is formed in first mold tool 1155, the intermediate part 1136 is positioned in a second mold tool 1180 (FIG. 46). The second mold tool 1180 may include a plurality of pins or the like (not shown) that engage locating openings (also not shown) in intermediate part 1136, to thereby position the intermediate part 1136 in second mold tool 1180. Second mold tool 1180 includes a first mold part 1181 and a second mold part 1182. First mold part 1181 includes a first cavity portion 1183 formed between the intermediate part 1136 and inner surface 1185. Similarly, second mold part 1182 forms a cavity portion 1184 between inner surface 1186 of second mold part 1182 and intermediate part 1136. Molten polymer material is injected into the cavity portions 1183 and 1184 to thereby overmold the protective capsules 1141 and 1142 and form the finished part 1100 (FIG. 31). Because the LEDs and/or other electrical components are protected by protective capsules 1141 and 1142, the polymer material flowing into cavity portion 1183 does not directly contact the LEDs and/or other electrical components. The protective capsules thereby ensure that the LEDs and/or other electrical components are not damaged due to excessive heat from the molten polymer material. The protective capsules also ensure that the LEDs and/or other electrical components are not dislodged due to forces generated by the molten polymer material. The small polymer layer 1161 on lower side 1137 of intermediate part 1136 is physically connected to the capsules 1141 and 1142 by polymer material that has flowed into gaps 1138 (see also FIG. 37) immediately adjacent the LEDs and other components. The small layer 1161 thereby mechanically secures the capsules 1141 and 1142 to the circuit 1101 to prevent dislodgement of the protective capsules 1141 and 1142 during the second shot molding step utilizing second mold tool 1180 of FIG. 46. The capsules 1141, 1142 and layer 1161 also serve to strengthen intermediate part 1136 to prevent damage due to bending or the like to thereby facilitate handling of part 1136.

Although the device 1100 has been described as being formed by a two-shot molding process, it will be understood that device 1100 or other such components may be made utilizing a single-shot molding process according to other aspects of the present invention. If a single-shot molding process is utilized, a web 1130 (FIG. 36) is first formed, and the LEDs and other components are then secured to the web 1130 (FIG. 37). The web 1130 with the electrical components secured thereto is then positioned in a mold tool having a mold cavity defining a shape that is substantially similar to the desired surface contour of the finished part.

Furthermore, according to other aspects of the present invention, more than two molding shots may be utilized if required for a particular application. If three or more molding shots are utilized, third or fourth mold tools (not shown) having additional cavity spaces are utilized. In the illustrated example, the polymer material utilized to form part 1100 comprises a light-transmitting colored polymer that is red, amber, or the like to provide a turn signal, brake light, or the like for a motor vehicle. In general, the LEDs may be chosen to have a color corresponding to the color of the polymer material to provide the desired color. If desired for a particular application, opaque polymer material may be injected over portions of the conductor 1101 during a first molding shot, or opaque polymer material may be overmolded in a second, third, or subsequent mold shot. In this way, the part 1100 may include both opaque polymer material and clear or other colored light-transmitting polymer material as required for a particular application.

Figure 47:
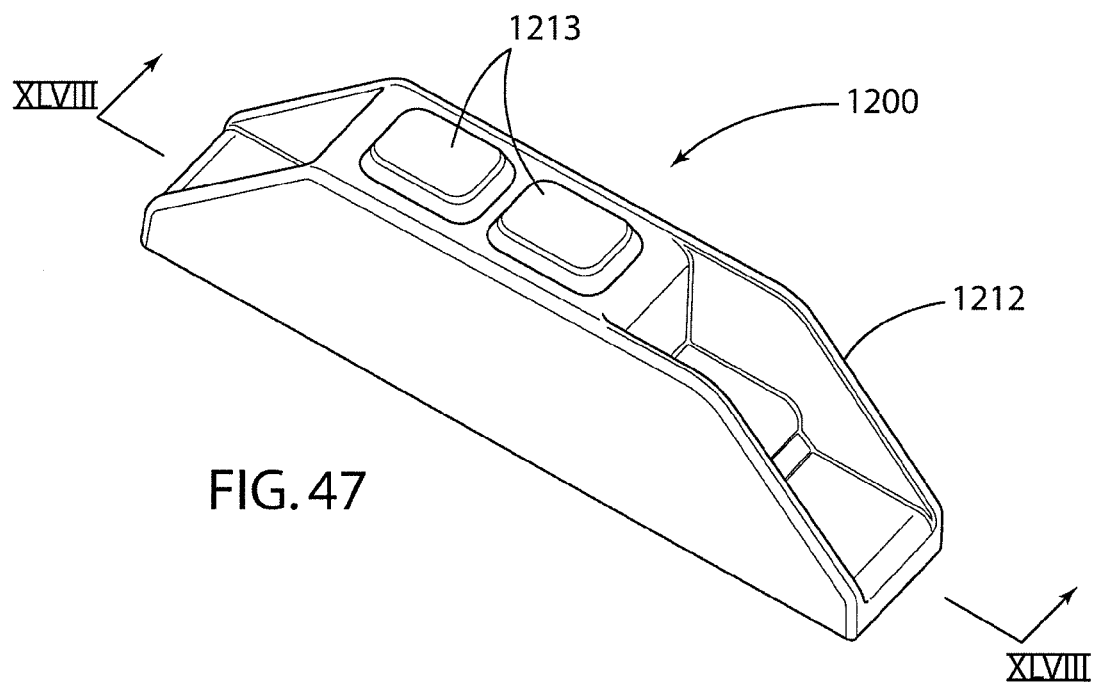
FIG. 47 is an isometric view of a device according to another aspect of the present invention.
Figure 48:
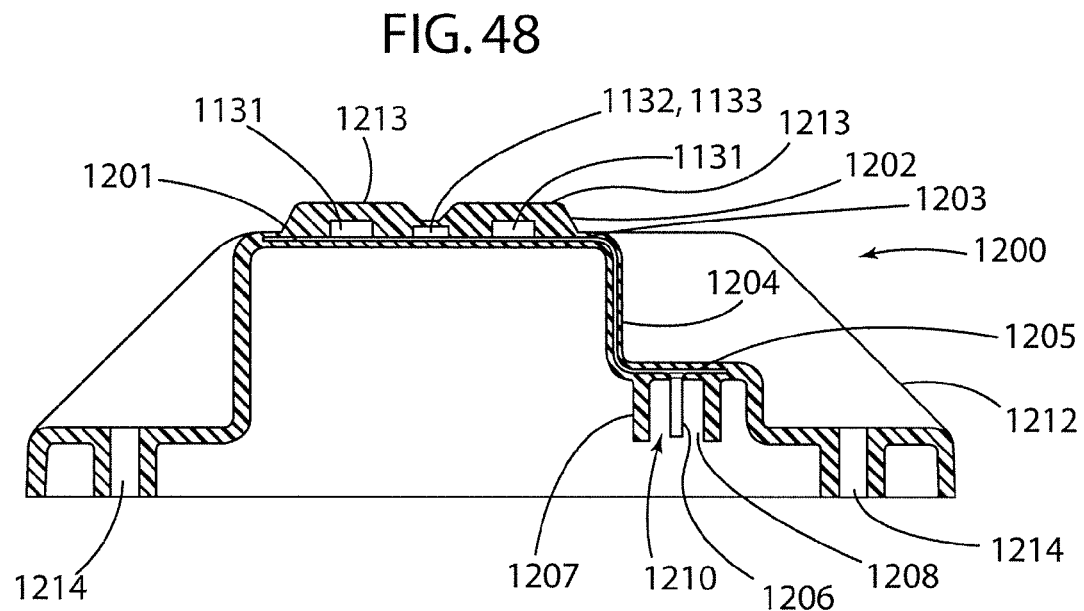
FIG. 48 is a cross-sectional view of the device of FIG. 47 taken along the line XLVIII-XLVIII.

With further reference to FIGS. 47 and 48, a device 1200 according to another aspect of the present invention comprises a light having one or more LEDs 1131 and electrical components 1132 and 1133 that are secured to a circuit 1201. The circuit 1201 and LEDs 1131, and other components 1132, 1133 are embedded in a polymer material body 1202 that may be formed in substantially the same manner as described in detail above in connection with the LED light assembly 1100. The circuit 1201 includes a generally flat primary portion 1203, and an intermediate portion 1204 that extends transversely away from flat primary portion 1203. An end portion 1205 of circuit 1201 extends transversely from intermediate portion 1204, and includes two or more cantilevered prongs 1206. The prongs 1206 are positioned within a receptacle 1210 formed by a generally cylindrical sidewall 1207 having an open end 1208. The receptacle 1210 provides a conventional electrical connector to connect the device 1200 to a 12 volt D.C. power source of a motor vehicle. Unlike a conventional flat circuit board, the metal circuit 1201 may be deformed into a non-planar three-dimensional shape as shown in FIG. 48, and it may be substantially encapsulated in polymer material forming a housing 1212 of device 1200. Device 1200 includes lens portions 1213 over the LEDs 1131 to provide the desired light distribution. In the illustrated example, the LEDs 1131 of device 1200 are white LEDs, and the polymer material utilized to form the housing 1212 is a substantially transparent polymer material. Device 1200 includes openings 1214 that receive conventional threaded fasteners or the like to secure the device 1200 to a vehicle, vehicle trailer, or the like. Device 1200 may illuminate a license plate, or other vehicle exterior component.

Although the devices 1100 and 1200 are described as being LED light assemblies, it will be understood that the device, methods, and tools of the present invention are not limited to light assemblies. Specifically, various electrical circuit components other than LEDs may be secured to a web, and the components may be overmolded utilizing a one-, two-, or more shot process as described in detail above. The polymer material utilized to overmold the electrical components may be opaque, and may be configured to provide decorative finished surface. In this way, separate housing and circuit board structures are eliminated. Components fabricated in this way may have a virtually unlimited range of shapes and configurations as required for a particular application. Furthermore, because the electrical components and the circuit material are overmolded and completely sealed within the polymer (with the possible exception of the exposed metal utilized to electrically connect the device to an external power source), a device fabricated according to the present invention is substantially waterproof, and very durable. Because the metal utilized to form the circuit can be bent into a wide variety of shapes, a device according to the present invention is not limited to a substantially flat configuration as with conventional circuit boards. A device according to the present invention may be configured to fit within a relatively confined three-dimensional space dictated by other design considerations such as aesthetics, packaging for other components, and the like.

An electrical device according to the present invention may comprise any one of a wide variety of devices including, for example, light assemblies for vehicle interiors, dashboard components, or other electrical devices that are not part of a vehicle, such as a camera, printer, computer, audio equipment, television, DVD player, microwave oven or other kitchen device or utensil utilizing electrical components, thermostats for controlling HVAC systems of buildings, communications equipment. The electrical device according to the present invention may also comprise an electrical device or light suitable for marine use, or it may comprise a children's toy or the like. Similarly, the electrical device may comprise an illuminated sign for use in a building or the like, or an exterior sign that may be illuminated, and may be attached to a building, or may be free-standing or attached to another structure. Still further, the electrical device may comprise a free-standing light suitable for use on a desk, table, or the like, or the device may comprise a hand-held light, or a light that is attachable to another device or the like. Still further, the electrical device may comprise a light for a semi-trailer, boat trailer, or other such application. Still further, the electrical device may comprise a light forming a turn signal, a stoplight for a vehicle, or the like. It will be appreciated that virtually any electrical component may be overmolded into a polymer structure, and the illustrated examples of LEDs, resistors, and diodes are merely examples of components that may be utilized to form an electrical device according to the present invention.

Also, it will be appreciated that the electrical device 1001 may be formed to have a wide variety of shapes, and the device 1001 need not be limited to a generally planar configuration as shown in the illustrated example. For example, the conductors forming the circuit may be formed into a wide variety of non-planar configurations, such that the electrical components are not all positioned in the same plane. In this way, the electrical device 1001 may be configured to fit within a limited space and thereby reduce the space required for the finished assembly. This, in turn, may substantially reduce the amount of wasted space that would otherwise occur if a planar circuit board were utilized.

In the foregoing description, it will be readily appreciated by those skilled in the art that modifications may be made to the invention without departing from the concepts disclosed herein.

The invention claimed is:

1. A method of fabricating an electrical assembly, comprising:
   providing a plurality of electrically conductive circuit elements;
   providing at least one circuit element comprising a board having a side surface and a plurality of conductive tracks disposed on the side surface of the board;
   securing at least one electrical component to at least a selected one of the conductive tracks;
   positioning at least a portion of the circuit element and the electrical component in a first mold cavity having a first shape;
   molding thermoplastic polymer material around the electrical component while it is in the first mold cavity to encapsulate the electrical component in a protective capsule of thermoplastic polymer material, the protective capsule having a first portion in contact with the conductive tracks and the board, the protective capsule having peripheral edge portions extending around at least a portion of the electrical component;
   positioning at least a portion of the circuit element and the electrical component in a second mold cavity having a second shape that is substantially different than the first shape;
   molding thermoplastic polymer material over at least a portion of the protective capsule.

2. The method of claim 1, wherein:
   the side surface of the board defines a generally flat surface portion;
   the peripheral edge portions of the protective capsule extend to the flat first surface portion and define a peripheral edge surface that is transverse to the flat surface portion.

3. The method of claim 2, wherein:
   an exposed portion of the flat surface portion of the board is not covered by the protective capsule of polymer prior to positioning the circuit element and the electrical component in the second mold cavity; and including:
   molding thermoplastic polymer material over the exposed portion.

4. The method of claim 3, wherein:
   the first mold cavity is shaped to mold thermoplastic polymer material over at least a substantial portion of the conductive circuit elements.

5. The method of claim 4, wherein:
   the first mold cavity forms a groove around the electrical component that is generally C-shaped in plan view, and wherein the first mold cavity is shaped such that a bridge of thermoplastic polymer material extending from the additional polymer material to the protective capsule is formed in the first mold cavity.

6. The method of claim 5, wherein:
   the groove defines a base surface, and at least a portion of the base surface comprises portions of the conductive tracks.

7. The method of claim 1, wherein:
   the step of securing at least one electrical component includes soldering the electrical component to the conductive tracks.

8. The method of claim 1, wherein:
   the one electrical component comprises an LED.

9. The method of claim 8, wherein:
   at least one additional electrical component in addition to the LED is secured to the circuit element; and
   a protective capsule of thermoplastic polymer material is molded over the additional electrical component in the first mold cavity.

10. The method of claim 1, wherein:
    the one electrical component comprises an integrated circuit having a generally quadrilateral perimeter;
    the peripheral edge of the protective capsule has a generally quadrilateral shape.

11. A method of fabricating an electrical device, comprising;
    providing a printed circuit board;
    mounting at least two electrical components on the printed circuit board;
    molding, in a first mold cavity, a barrier of thermoplastic polymer material around the two electrical components such that the thermoplastic polymer material at least partially covers the two electrical components;
    molding, in the first mold cavity, a bridge of thermoplastic polymer material linking the barriers;
    removing the printed circuit board and the two electrical components from the first mold cavity;
    positioning the printed circuit board and the two electrical components in a second mold cavity;
    injecting molten thermoplastic polymer material into the second mold cavity such that the molten thermoplastic polymer material encapsulates the barriers and the bridge.

12. The method of claim 11, wherein:
    the barrier comprises thermoplastic polymer material that is molded around the one electrical component after the one electrical component is mounted to the printed circuit board.

13. A method of fabricating an electrical device, comprising;
    providing a printed circuit board;
    mounting at least one electrical component on the printed circuit board;
    molding a barrier of thermoplastic polymer material around the one electrical component after the one electrical component is mounted to the printed circuit board;
    positioning the printed circuit board and the one electrical component in a mold cavity;
    injecting molten thermoplastic polymer material into the mold cavity such that the molten thermoplastic polymer material comes into contact with the barrier;
    the mold cavity comprises a second mold cavity defining a second shape;
    the thermoplastic polymer material is molded around the electrical component in a first mold cavity having a first shape that is substantially different than the second shape.

14. The method of fabricating an electrical device of claim 13, wherein:
    the barrier includes a generally dome-shaped portion.

15. The method of fabricating an electrical device of claim 14, including:
    forming a layer of thermoplastic polymer material on the printed circuit board in the mold cavity; and
    forming a groove around the dome-shaped portion of the barrier.

* * * * *